(12) United States Patent
Dong et al.

(10) Patent No.: US 10,686,094 B2
(45) Date of Patent: Jun. 16, 2020

(54) PHOTODETECTION ELEMENT

(71) Applicant: HAMAMATSU PHOTONICS K.K., Hamamatsu-shi, Shizuoka (JP)

(72) Inventors: Wei Dong, Hamamatsu (JP); Hiroyasu Fujiwara, Hamamatsu (JP); Kazutoshi Nakajima, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 16/114,360

(22) Filed: Aug. 28, 2018

(65) Prior Publication Data
US 2019/0074396 A1   Mar. 7, 2019

(30) Foreign Application Priority Data
Sep. 5, 2017  (JP) ................................. 2017-170180

(51) Int. Cl.
| H01L 31/108 | (2006.01) |
| H01L 31/0232 | (2014.01) |
| H01L 31/0224 | (2006.01) |
| G02B 6/122 | (2006.01) |
| H01L 31/0352 | (2006.01) |

(Continued)

(52) U.S. Cl.
CPC .......... *H01L 31/108* (2013.01); *G02B 6/1226* (2013.01); *H01L 31/0224* (2013.01); *H01L 31/0236* (2013.01); *H01L 31/02327* (2013.01); *H01L 31/03529* (2013.01); *H01L 31/035281* (2013.01); *G02B 2006/12061* (2013.01)

(58) Field of Classification Search
CPC ............... H01L 31/108; H01L 31/0236; H01L 31/03529; H01L 31/035281; H01L 31/02327; H01L 31/0224; G02B 6/1226; G02B 2006/12061
See application file for complete search history.

(56) References Cited

U.S. PATENT DOCUMENTS

| 4,593,304 A * | 6/1986 | Slayman | ........... H01L 31/02161 |
| | | | 257/457 |
| 2008/0237620 A1* | 10/2008 | Shiue | .................... H01L 33/405 |
| | | | 257/98 |

(Continued)

FOREIGN PATENT DOCUMENTS

| JP | 2659184 B2 | 9/1997 |
| JP | 2000-164918 A | 6/2000 |

(Continued)

*Primary Examiner* — Marcos D. Pizarro
*Assistant Examiner* — Sue Tang
(74) *Attorney, Agent, or Firm* — Faegre Drinker Biddle & Reath LLP

(57) ABSTRACT

A photodetection element includes a semiconductor layer having, on one surface side, a periodic concave/convex structure that includes periodic convex portions and concave portions and converts light into surface plasmon, and a metal film provided on the one surface side of the semiconductor layer in correspondence to the periodic concave/convex structure, and in the periodic concave/convex structure, a Schottky junction portion that has a Schottky junction with the metal film is provided on a base end side of the convex portion, and a non-Schottky junction portion that does not have a Schottky junction with the metal film is provided on a distal end side of the convex portion.

6 Claims, 26 Drawing Sheets

(51) Int. Cl.
*H01L 31/0236* (2006.01)
*G02B 6/12* (2006.01)

(56) References Cited

U.S. PATENT DOCUMENTS

2009/0134486 A1* 5/2009 Fujikata .......... H01L 31/022408
 257/449
2019/0058073 A1* 2/2019 Fujiwara ............. H01L 31/1013

FOREIGN PATENT DOCUMENTS

| JP | 2011-77274 A | 4/2011 |
|---|---|---|
| JP | 4789752 B2 | 10/2011 |

* cited by examiner

Fig.7

| | EXAMPLE | COMPARATIVE EXAMPLE |
|---|---|---|
| SCHOTTKY JUNCTION AREA PER PITCH OF CONCAVE PORTION | 0.0326μm² | 0.185μm² |
| AMOUNT OF LIGHT ABSORPTION IN ENTIRE METAL FILM | 0.90 | 0.80 |
| AMOUNT OF LIGHT ABSORPTION IN METAL FILM LOCATED IN CONCAVE PORTION (RATIO TO TOTAL) | 0.78 (87%) | 0.62 (78%) |
| EFFECTIVE AMOUNT OF ABSORPTION | 0.31 | 0.23 |

US 10,686,094 B2

PHOTODETECTION ELEMENT

TECHNICAL FIELD

The present disclosure relates to a photodetection element.

BACKGROUND

In the field of photodetection, there is an increasing demand for a technology capable of performing detection of near infrared light at low cost. The detection of near infrared light is expected to be applied to, for example, automatic driving technology for automobiles. An example of a photodetection element of the related art capable of detecting near infrared light includes a photodetection element using a compound semiconductor including an element of Group II to Group VI, but a process of fabricating a photodetection element using a compound semiconductor is complicated and expensive. Further, in a general PN junction type photodetection element, it is difficult to detect light having a wavelength longer than a band gap of silicon (equal to or greater than 1100 nm), and even in a photodetection element using black silicon, a detection limit at a longer wavelength is about 1200 nm.

On the other hand, in a Schottky type photodetection element using a Schottky junction, free electrons are excited due to light absorption inside a metal film, and the generated excited electrons (hot carriers) flow as a photocurrent to a semiconductor side beyond the Schottky barrier. Since a detection limit on the long wavelength side is determined by a height of the Schottky barrier, light with a wavelength longer than a band gap of silicon can be detected. Examples of such a Schottky type photodetection element include photodetection elements described in Japanese Patent No. 4789752, Japanese Unexamined Patent Publication No. 2000-164918, Japanese Unexamined Patent Publication No. 2011-77274, and Japanese Patent No. 2659184. Such a photodetection element of the related art is configured as a back-surface incidence type photodetection element in which a metal film that forms a Schottky junction with the semiconductor layer is provided on the surface of the semiconductor layer, and a back surface of the semiconductor layer is a light incidence surface. A periodic concave/convex structure is provided on the surface of the semiconductor layer, and a surface area of the metal film with respect to incident light is extended to achieve improved sensitivity.

SUMMARY

The sensitivity (the amount of photocurrent) of a Schottky junction type photodetection element described above is expressed by a product of the number of generated hot carriers, a probability of hot carriers reaching a Schottky barrier, and a probability of hot carriers going beyond the Schottky barrier. Since the number of generated hot carriers depends on the amount of light absorption in a metal film, it is effective to improve the amount of light absorption so as to improve the sensitivity of the photodetection element.

On the other hand, when a metal film is provided to cover the periodic concave/convex structure, a junction surface between a semiconductor layer and a metal film is formed on a bottom surface of concave portions, an inner wall surface of concave portions, and a top surface of convex portions. Therefore, it is thought that a Schottky junction area between the semiconductor layer and the metal film becomes larger than an area of the top surface of the convex portions and the bottom surface of the concave portions, which is an effective light reception area, such that a dark current increases. Therefore, a technology for realizing a photodetection element capable of detecting near infrared light with sufficient sensitivity while suppressing a dark current is desired.

The present disclosure has been made to solve the above-described problems, and an object of the present disclosure is to provide a photodetection element capable of detecting near infrared light with sufficient sensitivity while suppressing a dark current.

The applicant focused attention on the amount of light absorption of incident light according to a position on a metal film covering a periodic concave/convex structure in a process of studying the photodetection element. It was found that when a prototype of a photodetection element having a periodic concave/convex structure was fabricated and the amount of light absorption for each position was calculated, the amount of light absorption in the metal film varied from position to position, and higher light absorption occurred in a region corresponding to a base end side of the convex portion of the periodic concave/convex structure than in a region corresponding to a distal end side of the convex portion. According to this result, it was found that it is possible to realize a photodetection element capable of detecting near infrared light with sufficient sensitivity while suppressing a dark current by locally forming a junction surface between a semiconductor layer and a metal film according to a region in which a contribution to light absorption is high.

A photodetection element according to one aspect of the present disclosure includes: a semiconductor layer having, on one surface side, a periodic concave/convex structure that includes periodic convex portions and concave portions and converts light into surface plasmons; and a metal film provided on the one surface side of the semiconductor layer in correspondence to the periodic concave/convex structure, wherein in the periodic concave/convex structure, a Schottky junction portion that has a Schottky junction with the metal film is provided on a base end side of the convex portion, and a non-Schottky junction portion that does not have a Schottky junction with the metal film is provided on a distal end side of the convex portion.

In this photodetection element, the Schottky junction portion is locally provided on the base end side of the convex portion constituting the periodic concave/convex structure, and the non-Schottky junction portion is provided on the distal end side of the convex portion. Here, it is obtained from the above findings that, in the region corresponding to the base end side of the convex portion, higher light absorption occurs than in the region corresponding to the distal end side of the convex portion of the periodic concave/convex structure. Therefore, it is possible to obtain a photodetection element capable of detecting near infrared light with sufficient sensitivity while suppressing a dark current by providing the Schottky junction portion in the region in which the contribution to light absorption is high, providing the non-Schottky junction portion in the region in which the contribution to light absorption is low, and reducing a Schottky junction area between the semiconductor layer and the metal film.

Further, an insulating film may be provided on a top surface of the convex portions, the metal film may include a first portion covering a bottom surface and an inner wall surface of the concave portions, and a second portion covering the insulating film, and the Schottky junction portion may be formed of the first portion, and the non- Schottky junction portion may be formed of the second portion. In this case, since the non-Schottky junction portion formed of an insulating film is located on the top surface of the convex portions, an increase in the Schottky junction area between the semiconductor layer and the metal film can be prevented even when the area of the metal film is increased, and a sufficient degree of freedom of design for the metal film can be ensured. Further, since the second portion of the metal film is located on the top surface of the convex portions, light absorption efficiency in the first portion of the metal film can be improved due to the reflection of light in the second portion. Furthermore, since the insulating film to be used as a mask at the time of fabrication of the periodic concave/convex structure can be used as it is, simplification of the fabricating process can be achieved.

Further, a thickness of the insulating film may be equal to or smaller than a height of the convex portion. In this case, hot carriers generated in the metal film in the vicinity of the base end side of the convex portion can reach not only the Schottky junction portion on the bottom surface of the concave portions, but also the Schottky junction portion in a semiconductor layer region in the inner wall surface of the concave portions. Therefore, sensitivity of the photodetection element can be further improved.

The convex portion may be formed of an insulating film, the metal film may include a first portion covering a bottom surface of the concave portions, and a second portion covering the convex portion, and the Schottky junction portion may be formed of the first portion, and the non-Schottky junction portion may be formed of the second portion. In this case, a bottom surface region of the concave portion in which the contribution to light absorption is high becomes the Schottky junction portion, and a sufficient sensitivity of the photodetection element can be ensured. Further, since the entire convex portion is a non-Schottky junction portion, an increase in the Schottky junction area between the semiconductor layer and the metal film can be prevented even when an area of the metal film increases, and a sufficient degree of freedom of design of the metal film can be ensured. Further, since a surface of the semiconductor layer in contact with the metal film and a surface of the semiconductor layer in contact with the insulating film are substantially flat, lattice defects can be reduced and a dark current can be further reduced.

Further, a refractive index of the insulating film may be smaller than a refractive index of the semiconductor layer. In this case, light can be easily confined in the first portion of the metal film, and light absorption efficiency can be further improved.

Further, the metal film may include a first portion covering a bottom surface and an inner wall surface of the concave portions, and a second portion provided on the top surface side of the convex portion so as to connect portions of the first portions in adjacent concave portions, and the Schottky junction portion may be formed of the first portion, and the non-Schottky junction portion may be formed of a region in which the second portion is not formed. In this case, the Schottky junction portion and the non-Schottky junction portion can be realized with a simple configuration.

The first portion may have a projection portion projecting from the top surface of the convex portions, and the second portion may be provided to be spaced apart from a top surface of the convex portions so as to connect the projection portions. In this case, even when the area of the second portion of the metal film is increased, an increase in the Schottky junction area between the semiconductor layer and the metal film can be prevented. Therefore, since the area of the metal film can be sufficiently ensured, the electric resistance of the photodetection element can be reduced.

Further, an ohmic electrode having an ohmic junction with the semiconductor layer may be provided on the top surface of the convex portions, the metal film may be provided to cover a bottom surface and an inner wall surface of the concave portions, the Schottky junction portion may be formed of the metal film, and the non-Schottky junction portion may be formed of the ohmic electrode. In this case, light absorption efficiency in the metal film can be improved due to reflection of light in the ohmic electrode provided on the top surface of the convex portions. Further, since the ohmic electrode is located on the top surface of the convex portions, an element area can be reduced. Therefore, miniaturization of and highly integrating the photodetection element can be achieved.

Further, a thickness of the metal film may be equal to or greater than 20 nm. When the thickness of the metal film is equal to or greater than 20 nm, the effective amount of absorption of light in the metal film is maximized, and the sensitivity of the photodetection element can be improved.

Further, the semiconductor layer may be formed of silicon. Accordingly, the photodetection element can be fabricated at low cost.

Further, the metal film may include aluminum. In this case, a process of fabricating the metal film is facilitated.

Further, the metal film may be formed of a plurality of films including a first film in contact with the semiconductor layer and a second film with a refractive index smaller than that of the first film element. In this case, light can be confined in the vicinity of the interface with the semiconductor layer in the metal film, and the amount of light absorption can be further improved.

Further, the concave portions in the periodic concave/convex structure may have a matrix-shaped arrangement pattern in a plan view. When a matrix-shaped arrangement pattern is adopted, light in all polarization direction is uniformly converted to surface plasmons. Therefore, it is possible to detect light independently of a polarization direction.

Also, a transverse sectional shape of the concave portion may be a circular or rectangular shape. When a circular shape is adopted as the transverse sectional shape of the concave portion, an area in which light is affected by the periodicity of the periodic concave/convex structure is reduced, and therefore, the light is converted into surface plasmon in a wide wavelength range. Therefore, it is possible to detect light over a wide wavelength range. When a rectangular shape is adopted as the transverse sectional shape of the concave portion, an area in which light is affected by the periodicity of the periodic concave/convex structure is increased, and therefore, the light is converted into strong surface plasmon at a specific wavelength. Therefore, it is possible to detect light with high sensitivity at the specific wavelength.

Further, the concave portion in the periodic concave/convex structure may have a stripe-shaped arrangement pattern in a plan view. When a stripe-shaped arrangement pattern is adopted, only light of which an electric field vector is orthogonal to the stripe-shaped arrangement pattern is converted into a strong surface plasmon in the periodic concave/convex structure. Therefore, it is possible to detect light with high sensitivity in one polarization direction.

Further, the concave portions in the periodic concave/convex structure may have a concentric circular arrangement pattern in a plan view. When a concentric circular arrangement pattern is adopted, light in any polarization directions is uniformly converted to surface plasmon. Therefore, it is possible to detect light independently of a polarization direction.

Further, the concave portions in the periodic concave/convex structure may have a concentric polygonal arrangement pattern in a plan view. When a concentric polygonal arrangement pattern is adopted, only light of which an electric field vector is orthogonal to each side of a concentric polygonal arrangement pattern is converted into strong surface plasmon in the periodic concave/convex structure. Therefore, it is possible to detect light with high sensitivity in two polarization directions.

As described above, according to the photodetection element according to the present disclosure, it is possible to detect near infrared light with sufficient sensitivity while suppressing a dark current.

BRIEF DESCRIPTION OF THE DRAWINGS

FIG. 7 is a diagram illustrating evaluation results of the photodetection element for primary evaluation and the photodetection element for secondary evaluation.

DETAILED DESCRIPTION

Hereinafter, preferred embodiments of a photodetection element according to an aspect of the present disclosure will be described in detail with reference to the drawings.

Figure 1:
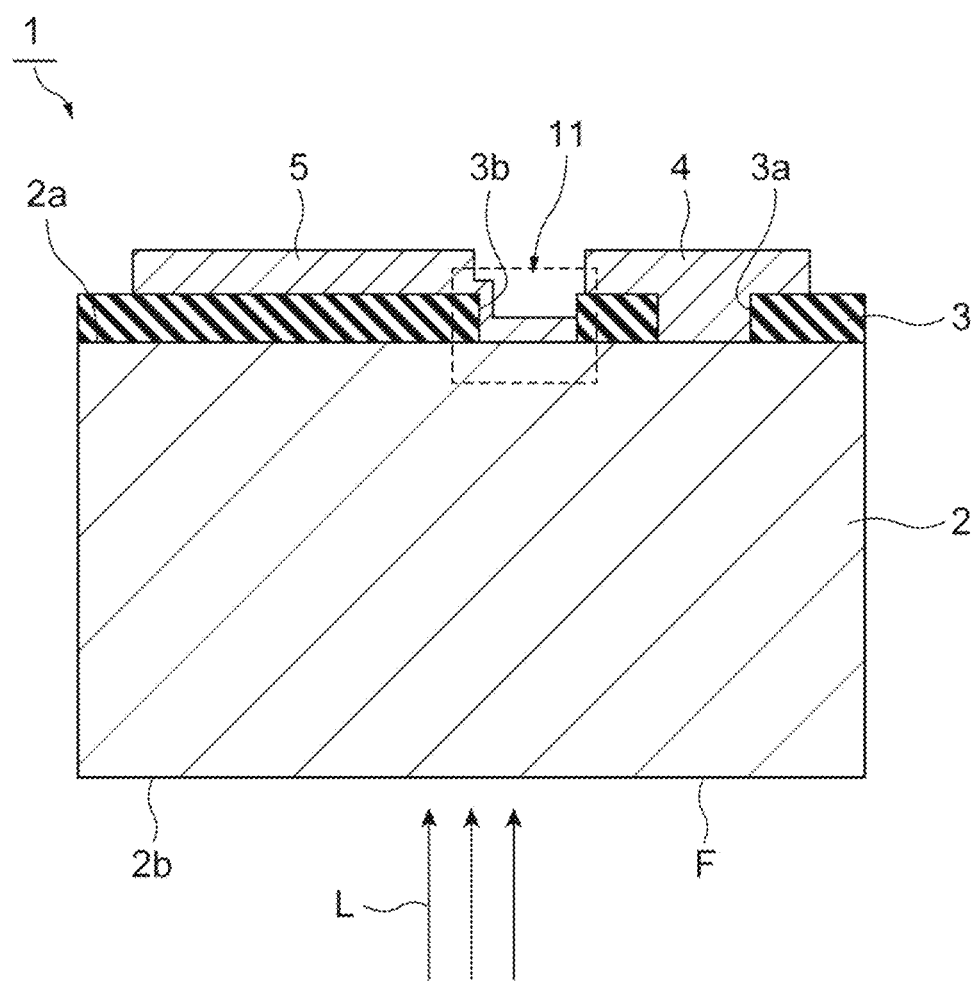
FIG. 1 is a cross-sectional view illustrating an embodiment of a photodetection element.

FIG. 1 is a cross-sectional view illustrating an embodiment of a photodetection element. This photodetection element 1 is configured as a Schottky junction type photodetection element to be used for detection of near infrared light having a wavelength equal to or greater than, for example, 1200 nm. As illustrated in FIG. 1, the photodetection element 1 includes a semiconductor layer 2, an insulating film 3, an ohmic electrode 4, and a Schottky electrode 5.

The semiconductor layer 2 is a semiconductor layer formed of, for example, silicon (Si), titanium oxide ($TiO_2$), germanium (Ge), gallium phosphide (GaP), or the like. In this embodiment, the semiconductor layer 2 formed of n-type or p-type silicon for realizing a more inexpensive fabricating process is illustrated. The photodetection element 1 is a back-surface incidence type photodetection element, and a back surface 2b of the semiconductor layer 2 is an incidence surface F for light L detected by the photodetection element 1.

The insulating film 3 is formed on a surface 2a of the semiconductor layer 2 using, for example, silicon dioxide ($SiO_2$). A thickness of the insulating film 3 is about 100 nm, for example. In the insulating film 3, an opening 3a for realizing an ohmic junction between the ohmic electrode 4 and the semiconductor layer 2 and an opening 3b for realizing a Schottky junction between the Schottky electrode 5 and the semiconductor layer 2 are formed. The insulating film 3 is formed using, for example, a chemical vapor deposition method. For formation of the openings 3a and 3b, for example, photolithography is used.

The ohmic electrode 4 is formed of materials including, for example, gold (Au), germanium (Ge), indium (In), nickel (Ni), and platinum (Pt). The ohmic electrode 4 is provided to cover the opening 3a of the insulating film 3 on a front surface 2a of the semiconductor layer 2 and has an ohmic junction with the semiconductor layer 2 on a bottom surface of the opening 3a. The Schottky electrode 5 is formed of materials including, for example, gold (Au), silver (Ag), titanium (Ti), aluminum (Al), copper (Cu), and platinum (Pt). The Schottky electrode 5 is provided to cover the opening 3b of the insulating film 3 on a surface of the semiconductor layer 2 and has a Schottky junction with the semiconductor layer 2 on the bottom surface of the opening 3b. The ohmic electrode 4 and the Schottky electrode 5 are formed, for example, using a vacuum evaporation method. When a conductivity type of the semiconductor layer 2 is n type, a bias voltage is applied so that a potential of the Schottky electrode 5 is lower than a potential of the ohmic electrode 4 at the time of an operation of the photodetection element 1. When the conductivity type of the semiconductor layer 2 is p type, a bias voltage is applied so that the potential of the Schottky electrode 5 is higher than the potential of the ohmic electrode 4 at the time of an operation of the photodetection element 1. In either case, the bias voltage may be zero.

Figure 2:
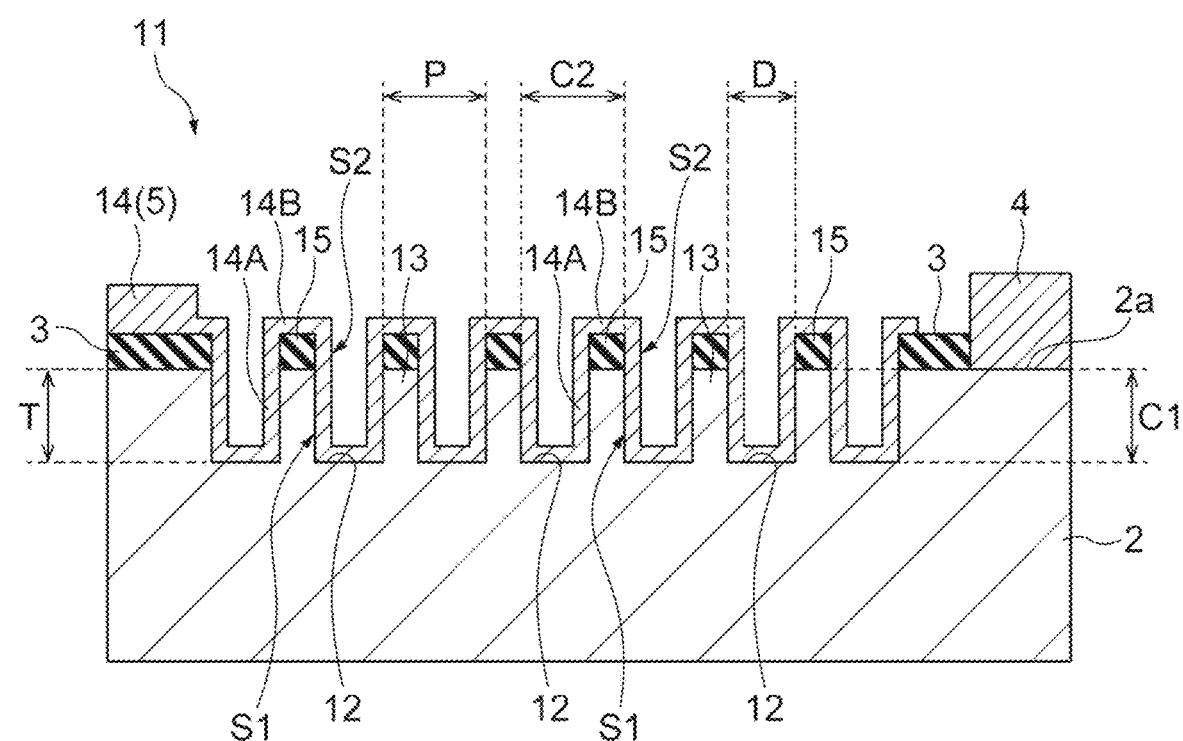
FIG. 2 is an enlarged cross-sectional view of main parts illustrating a configuration in the vicinity of a periodic concave/convex structure in the photodetection element illustrated in FIG. 1.
Figure 3:
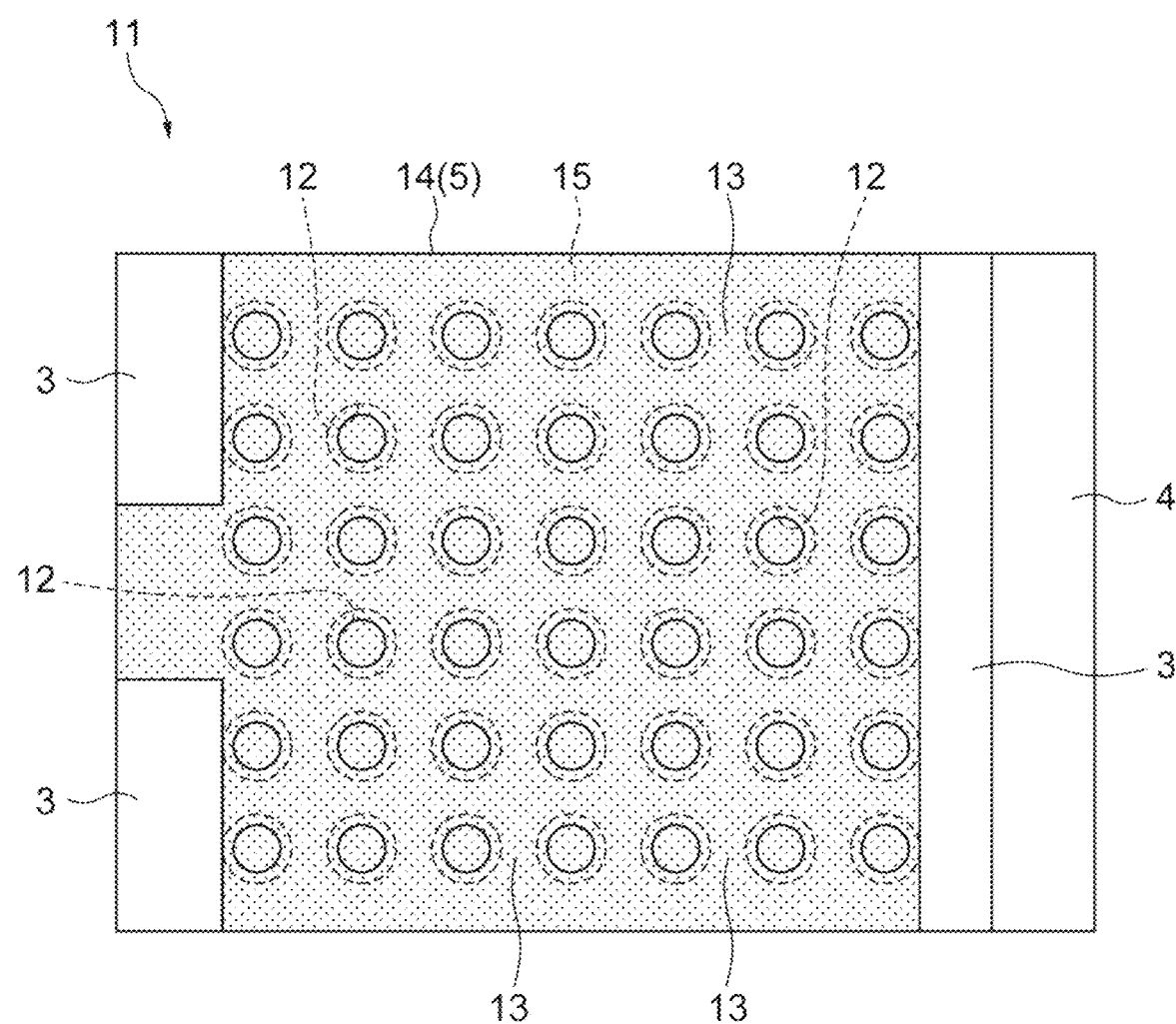
FIG. 3 is a plan view illustrating an arrangement pattern of concave portions in the periodic concave/convex structure.

Further, a periodic concave/convex structure 11 that converts the light L incident from the incidence surface F into surface plasmon is provided at a position corresponding to the opening 3b of the insulating film 3 in the front surface 2a of the semiconductor layer 2. FIG. 2 is an enlarged cross-sectional view of main parts illustrating a configuration of the vicinity (a broken line portion in FIG. 1) of a periodic concave/convex structure. Further, FIG. 3 is a plan view illustrating an arrangement pattern of a concave portion in the periodic concave/convex structure. As illustrated in FIGS. 2 and 3, the periodic concave/convex structure 11 includes, for example, a concave portion 12 and a convex portion 13 formed in a nano order in an area equal to or greater than a spot size of the light L incident from the incidence surface F. The concavo-convex pattern formed of the concave portion 12 and the convex portion 13 is formed using, for example, an electron beam exposure method, a method in which lithography based on nanoimprinting and reactive ion etching or lift-off are combined, or a direct processing method using a focused ion beam.

In the embodiment, as illustrated in FIG. 3, the concave portions 12 constituting the periodic concave/convex structure 11 have a matrix-shaped arrangement pattern in a plan view. In the example of FIG. 3, an arrangement pitch in a row direction and an arrangement pitch in a column direction of the concave portions 12 are coincident with each other. Further, the concave portion 12 has a cylindrical shape, a transverse sectional shape of the concave portion 12 is a circular shape, and a longitudinal sectional shape of the concave portion 12 is a rectangular shape (see FIG. 2). With such an arrangement pattern, the periodic concave/convex structure 11 constitutes a longitudinal resonator C1 and a transverse resonator C2 with respect to the light L incident from the incidence surface F, as illustrated in FIG. 2. The longitudinal resonator C1 is a resonator formed in a height direction of concavo-convex portions, and is constituted by a bottom surface of the convex portion 13 and a top surface of the convex portions 13. Further, the transverse resonator C2 is a resonator formed in the arrangement direction of the concavo-convex portions, and is constituted by the same positions on an inner wall surface of one concave portion 12 and an inner wall surface of an adjacent concave portion 12.

A height T of the convex portion 13 (=a depth of the concave portion 12), an arrangement pitch P of the convex portion 13, and a width D of the concave portion in the periodic concave/convex structure 11 are set, for example, such that the resonance wavelength of the longitudinal resonator C1 and the resonance wavelength of the transverse resonator C2 are aligned. More specifically, when the wavelength of the surface plasmon generated in the periodic concave/convex structure 11 is $\lambda_p$, the height T of the convex portion 13 satisfies $3/8\lambda_p < T < 5/8\lambda_p$, and the arrangement pitch P of the convex portion 13 satisfies $9/10\lambda_p < P < 11/10\lambda_p$. Further, the width D of the concave portion 12 (here, a diameter of the concave portion 12) satisfies 50 nm$< D <\lambda_p - 50$ nm. Here, these ranges are merely examples, and the height T of the convex portion 13, the arrangement pitch P of the convex portion 13, and the width D of the concave portion may be outside the above ranges.

Further, an insulating film 15 is provided on a top surface of the convex portions 13 in the periodic concave/convex structure 11. The insulating film 15 is patterned only on the top surface of the convex portions 13, for example, by photolithography. A thickness of the insulating film 15 is, for example, 10 nm to 150 nm and is equal to or smaller than the height T of the convex portion 13. The thickness of the insulating film 15 may be equal to the thickness of the insulating film 3. It is preferable for a refractive index of the insulating film 15 with respect to the light L to be smaller than the refractive index of the semiconductor layer 2 with respect to the light L. In the embodiment, the insulating film 15 is formed of, for example, silicon dioxide ($SiO_2$) similar to the insulating film 3, and an insulating film to be used as a mask at the time of fabricating the periodic concave/convex structure 11 is used as it is as the insulating film 15. Examples of other constituent materials of the insulating film 15 may include magnesium fluoride ($MgF_2$), silicon nitride (SiN), titanium oxide ($TiO_2$), and aluminum oxide ($Al_2O_3$).

As illustrated in FIG. 2, the metal film 14 constituting the Schottky electrode 5 is formed so as to cover the periodic concave/convex structure 11 and the insulating film 15. That is, the metal film 14 includes a first portion 14A that covers a top surface of the convex portions 13, a bottom surface of the concave portions 12, and an inner wall surface of the concave portions 12 in the periodic concave/convex structure 11, and a second portion 14B that covers the insulating film 15 provided on the top surface of the convex portions 13. With such a configuration of the metal film 14, in the periodic concave/convex structure 11, a Schottky junction portion S1 that has a Schottky junction with the metal film 14 is formed on a base end side of the convex portion 13.

Further, a non-Schottky junction portion S2 that does not have a Schottky junction with the metal film 14 is formed on a distal end side of the convex portion 13. In the embodiment, on the base end side of the convex portion 13, the bottom surface of the concave portions 12 and the inner wall surface of the concave portions 12 form the Schottky junction portion S1 with the first portion 14A of the metal film 14 and, on the distal end side of the portion 13, the insulating film 15 provided on the top surface of the convex portions 13 forms the non-Schottky junction portion S2 between the second portion 14B of the metal film 14.

When the semiconductor layer 2 is formed of silicon as in this embodiment, it is preferable for the metal film 14 to be a single layer film of aluminum (Al) in consideration of ease of fabrication using a silicon process. Further, the metal film 14 may be a multilayer film. In this case, the metal film 14 may be formed as a film of a plurality of layers including a first film in contact with the semiconductor layer 2 and a second film with a refractive index smaller than that of the first film. Examples of a combination of materials of the first film and the second film may include titanium (Ti)/gold (Au), titanium (Ti)/silver (Ag), aluminum (Al)/gold (Au), and titanium (Ti)/aluminum (Al).

In the vicinity of a Schottky junction portion S1 in the semiconductor layer 2, a depletion layer is formed with the Schottky junction with the metal film 14. The light L incident from the incidence surface F is confined in the longitudinal resonator C1 and the transverse resonator C2 and is converted into a propagating surface plasmon propagating on the surface of the metal film 14. Due to vibration of the light L resonating with the surface plasmon, the energy of the light L is absorbed by the metal film 14. Free electrons are excited by light absorption inside the metal film 14, and generated hot carriers flow as a photocurrent to the semiconductor layer 2 beyond the Schottky barrier.

In the embodiment, a thickness of the metal film 14 is equal to or greater than 20 nm in order to improve efficiency of light absorption in the metal film 14. The sensitivity (the amount of photocurrent) of the Schottky junction type photodetection element is expressed by a product of the number of generated hot carriers, a probability of the hot carriers reaching the Schottky barrier, and a probability of the hot carriers going beyond the Schottky barrier. Since the number of generated hot carriers depends on the amount of light absorption in the metal film, it is effective to improve the amount of light absorption in the metal film so as to improve the sensitivity of the photodetection element.

A transport probability (a probability of moving a distance r) from a generation position of excited electrons is expressed by $\exp(-r/L)$. L is a mean free path inside the metal film and is approximately 30 nm. When a shortest distance from the generation position of the excited electrons to an interface of the semiconductor layer is z, the distance z is a distance of a perpendicular line connecting the generation position of the excited electrons to the interface of the semiconductor layer. Therefore, when an angle formed by a traveling direction of the excited electrons and the perpendicular line is θ, the transport probability of the excited electrons is $\exp(-r/L \cos \theta)$. An integrated value (hereinafter, the integrated value is referred to as "effective amount of absorption") obtained by multiplying the amount of light absorption at a position at which excited electrons are generated inside the electrode film by the transport probability and performing volume integration over the entire inside of the electrode film is a value proportional to the sensitivity of the Schottky junction type photodetection element.

A sample of a photodetection element having a periodic slit structure as a Schottky electrode was prepared so as to evaluate the amount of light absorption in the metal film using the effective amount of absorption. In this photodetection element for evaluation, a Schottky electrode with a thickness of 370 nm was formed on a semiconductor layer formed of silicon (Si), and slits were formed with a width of 100 nm at a period of 850 nm in the Schottky electrode by a focused ion beam device. The slits were through slits and were formed so that a surface of the semiconductor layer was exposed.

Samples of two types including a sample in which a metal film constituting the Schottky electrode was formed as a single layer of gold (Au) and a sample in which the metal film was formed as two layers of titanium (Ti)/gold (Au) from a semiconductor layer side were prepared. In the latter, a thickness of the titanium (Ti) layer was 2 nm. For the two types of samples, a sensitivity ratio was obtained experimentally and found to be about 0.54. A difference in sensitivity between the two samples was considered to be due to the fact that a spatial distribution of light and a spatial distribution of light absorption inside the metal film were different due to differences in a constituent electrode film and differences in the effective amount of absorption occurring. It was therefore concluded that the ratio of sensitivity between the two samples is equivalent to the ratio of the effective absorption between the two samples.

Figure 4:
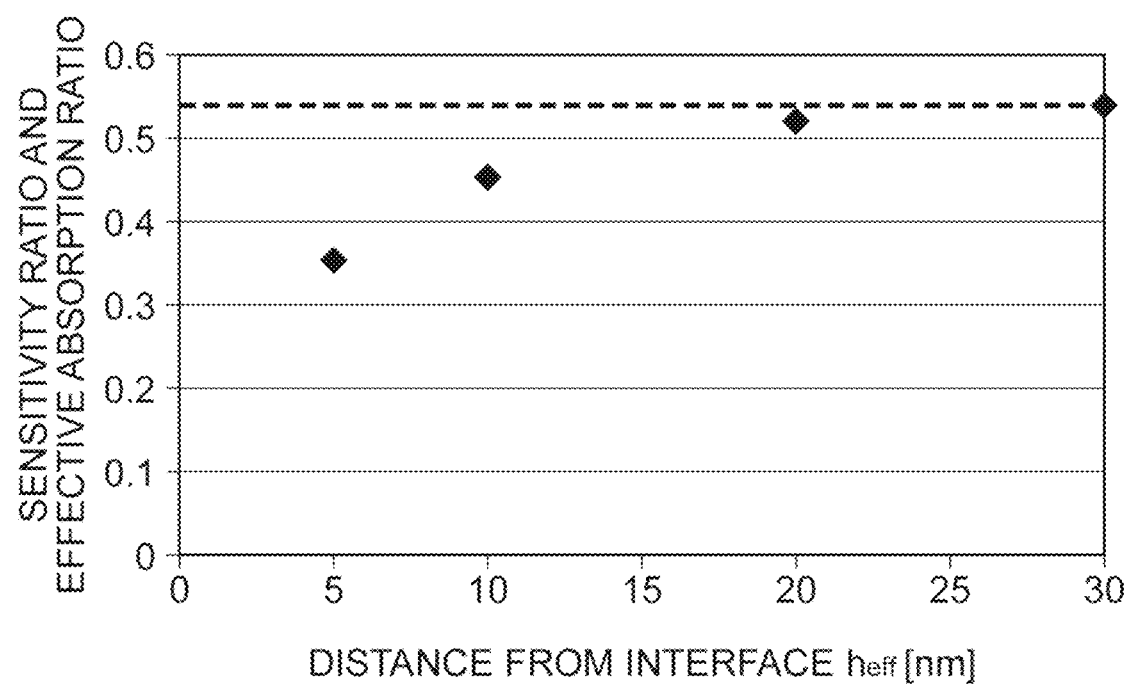
FIG. 4 is a diagram illustrating a relationship between a distance from an interface of a semiconductor layer and ratios of sensitivity and an effective amount of absorption.

FIG. 4 is a diagram illustrating a relationship between the distance from the interface of the semiconductor layer and ratios of sensitivity and an effective amount of absorption. In FIG. 4, a horizontal axis indicates a distance $h_{eff}$ from the interface of the semiconductor layer, and a vertical axis indicates the sensitivity ratio and the ratio of the effective amount of absorption. A plot in FIG. 4 is obtained through simulation of a ratio of the effective amount of absorption from the interface of the semiconductor layer to the distance $h_{eff}$ for the two types of samples. From these results, it can be seen that as the distance $h_{eff}$ increases, the ratio of the effective amount of absorption increases, and the ratio of the effective amount of absorption becomes constant when the distance $h_{eff}$ becomes equal to or greater than 20 nm. Further, the ratio of the effective amount of absorption when the distance $h_{eff}$ is equal to or greater than 20 nm is approximately 0.54, which is substantially equal to the sensitivity ratio (a value indicated by a dotted line in FIG. 4) obtained by experiments.

From this result, it can be seen that when the thickness of the metal film does not reach 20 nm, the effective amount of absorption is insufficient and the sensitivity of the photodetection element cannot be sufficiently obtained. Further, when the thickness of the metal film is equal to or greater than 20 nm, it can be seen that the effective amount of absorption is maximized and the sensitivity of the photodetection element can be improved. This means that it is effective to increase the effective amount of absorption of the metal film in the range between the interface of the semiconductor layer and 20 nm so as to improve the sensitivity of the Schottky junction type photodetection element.

On the other hand, representative characteristics of the photodetection element include a dark current, in addition to the sensitivity. A dark current is a current flowing in a state in which no light is incident on the photodetection element. Since a dark current affects a detection limit of light in a low illuminance region, it is desirable for the dark current to be minimized regarding the characteristics of a photodetection element. In the photodetection element, when the metal film is provided to cover the periodic concave/convex structure, a junction surface between the semiconductor layer and the metal film is formed on the bottom surface of the concave portions, the inner wall surface of the concave portions, and the top surface of the convex portions. Therefore, it is thought that the Schottky junction area between the semiconductor layer and the metal film becomes larger than the area of the top surface of the convex portions and the bottom surface of the concave portions, which is an effective light reception area, and the dark current increases.

Figure 5A:
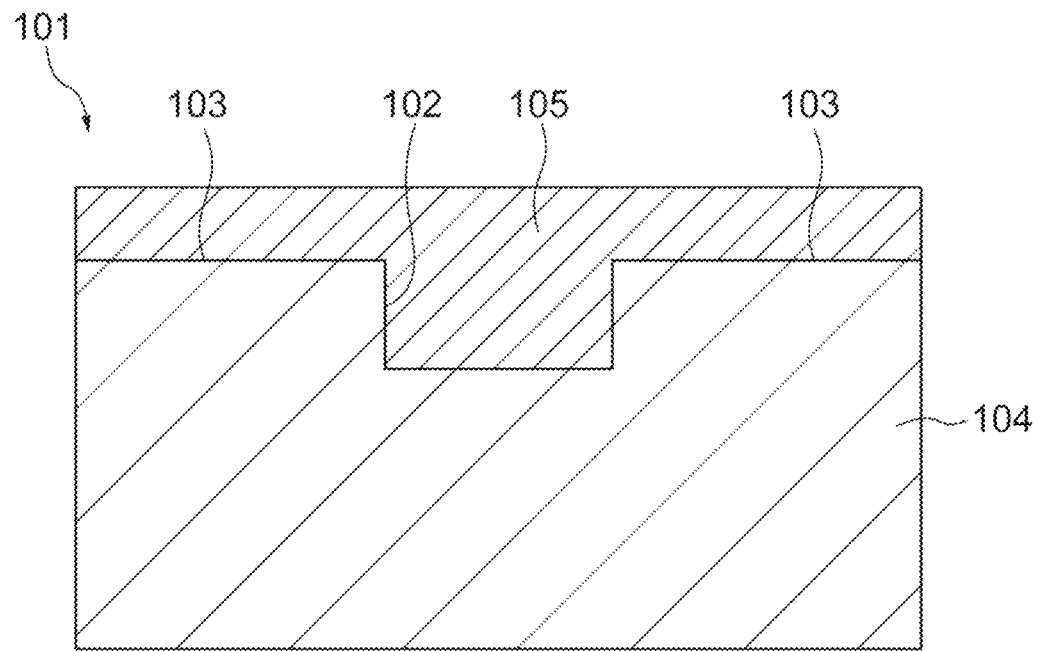
FIG. 5A is a schematic view illustrating main parts of a photodetection element for primary evaluation.

Here, the applicant focused attention on the amount of light absorption of incident light due to a position on the metal film covering the periodic concave/convex structure in a process of studying the photodetection element, and fabricated a prototype of a detection element for primary evaluation having a periodic concave/convex structure. In the detection element for primary evaluation, as illustrated in FIG. 5A, a periodic concave/convex structure 101 including concave portions 102 and convex portions 103 is formed on one surface of a semiconductor layer 104 formed of silicon, and a metal film 105 is formed to cover the periodic concave/convex structure 101. In the photodetection element for primary evaluation, in the periodic concave/convex structure 111, the bottom surface and the inner wall surface of the concave portions 102 and the top surface of the convex portions 103 are a Schottky junction portion that has a Schottky junction with the metal film 105. A cross-sectional shape of the concave portion 102 is a circular shape, and a height of the convex portion 103 (a depth of the concave portion 102) is 50 nm. An arrangement pitch of the concave portions 102 is 400 nm, and a width (diameter) of the concave portions 102 is 160 nm. Further, a constituent material of the metal film 105 is gold (Au) and a thickness thereof is 30 nm.

Figure 5B:
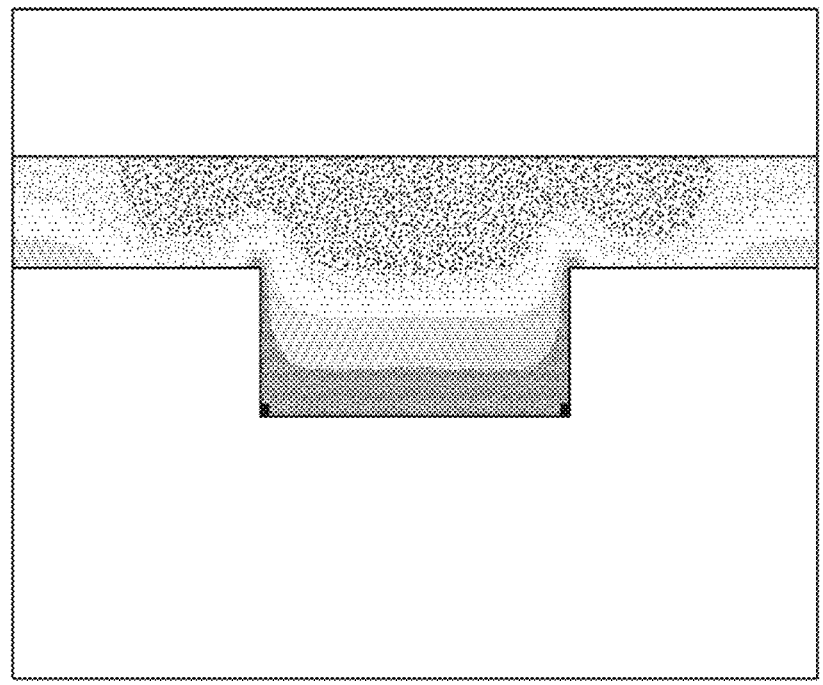
FIG. 5B is a diagram illustrating a distribution of the amount of light absorption of the photodetection element for primary evaluation.

FIG. 5B is a diagram illustrating a simulation result of a spatial portion of the amount of light absorption in the photodetection element for primary evaluation. In the simulation, near infrared light with a wavelength of 1500 nm was incident on the photodetection element for primary evaluation, and the amount of light absorption at each position on the metal film 105 was calculated. From the result illustrated in FIG. 5B, it can be seen that regions with a large amount of light absorption are concentrated in the concave portion 102. The amount of light absorption in the metal film 105 located in the concave portion 102 accounted for about 78% of the amount of light absorption in the entire metal film 105. From this result, it can be concluded that the semiconductor layer and the metal film have a Schottky junction with each other in the region in which the amount of light absorption is large and the semiconductor layer and the metal film does not have a Schottky junction with each other in the region in which the amount of light absorption is small, such that a dark current can be suppressed while maintaining sensitivity of the photodetection element.

Figure 6A:
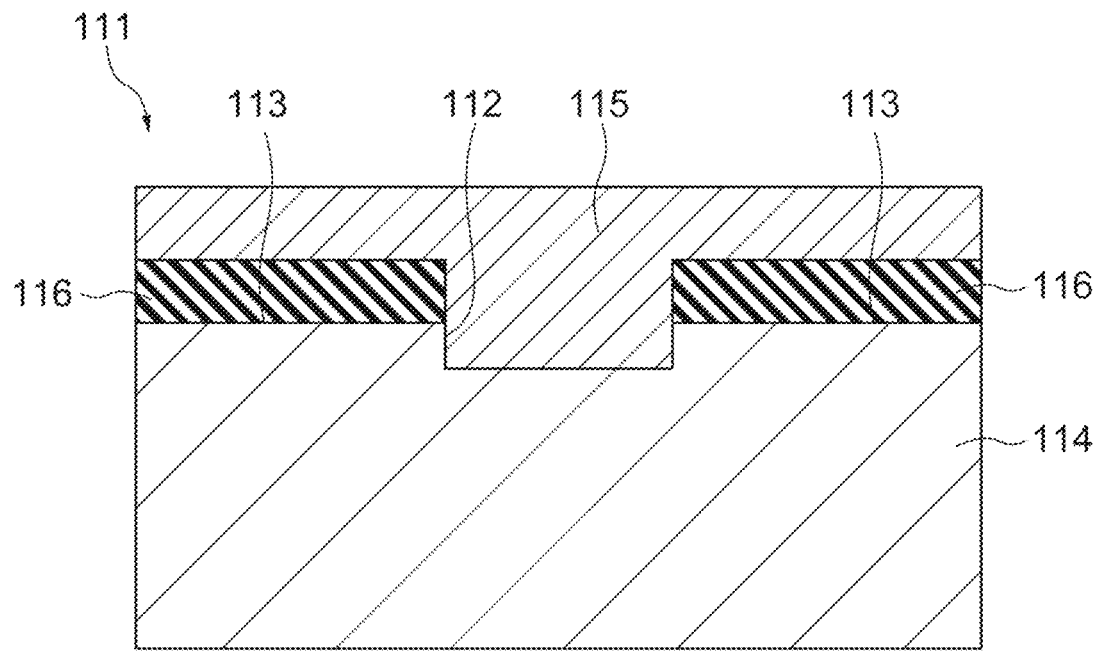
FIG. 6A is a schematic view illustrating main parts of a photodetection element for secondary evaluation.

A photodetection element for secondary evaluation illustrated in FIG. 6A was fabricated on the basis of the above findings. As illustrated in FIG. 6A, in the photodetection element for secondary evaluation, the periodic concave/convex structure 111 having the concave portions 112 and the convex portions 113 was formed on one surface of the semiconductor layer 114 formed of silicon, an insulating film 116 formed of silicon nitride (SiN) was formed with a thickness of 25 nm on a top surface of the convex portions 113, and a metal film 115 was formed to cover the periodic concave/convex structure 111 and the insulating film 116. That is, in the photodetection element for secondary evaluation, a Schottky junction portion that has a Schottky junction with the metal film 115 was provided on a base end side of the convex portion 113, and a non-Schottky junction portion that does not have a Schottky junction with the metal film 115 was provided on a distal end side of the convex portion 113. A concavo-convex pattern in the periodic concave/convex structure 111 was the same as that of the photodetection element for primary evaluation.

Figure 6B:
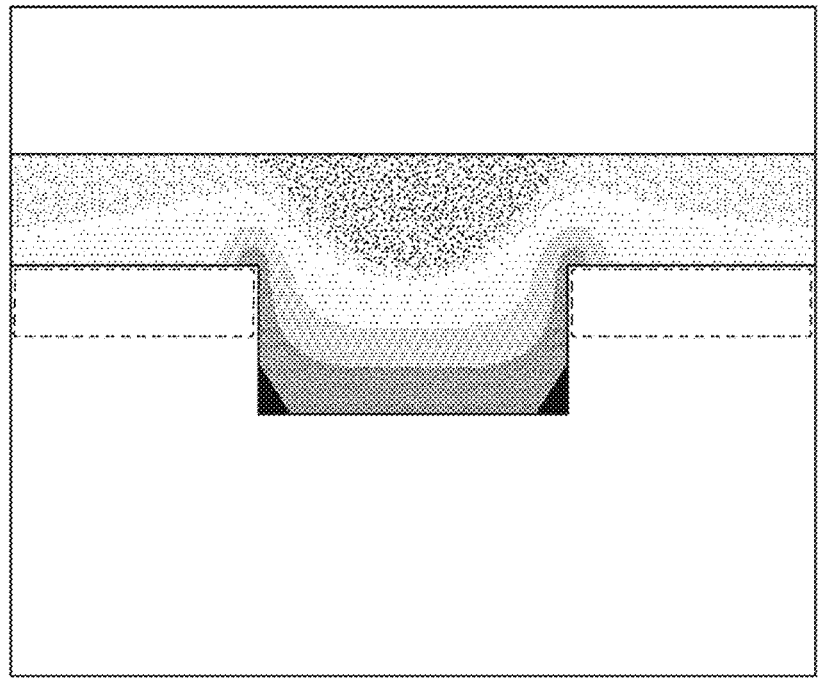
FIG. 6B is a diagram illustrating a distribution of the amount of light absorption of the photodetection element for secondary evaluation.

FIG. 6B is a diagram illustrating a simulation result of a spatial portion of the amount of light absorption in the photodetection element for secondary evaluation. Further, FIG. 7 is a diagram illustrating evaluation results of the photodetection element for primary evaluation and the photodetection element for secondary evaluation. In FIG. 6B, a portion corresponding to the insulating film 116 is indicated by a broken line. As illustrated in FIG. 7, in the photodetection element for primary evaluation, the Schottky junction area per pitch of the concave portion 112 is 0.185 $\mu m^2$, whereas in the photodetection element for secondary evaluation, the Schottky junction area per pitch of the concave portion 102 is 0.0326 $\mu m^2$, and the Schottky junction area is reduced to be lower than 18%. In the photodetection element for secondary evaluation, since the Schottky junction area is reduced, the dark current is sufficiently suppressed as compared with the photodetection element for primary evaluation.

Further, in the photodetection element for primary evaluation, the total amount of light absorption of the metal film 105 with respect to the incident light was 0.8, the amount of light absorption in the metal film 105 located in the concave portion 102 (a ratio to the total amount of light absorption) was 0.62, and the effective amount of absorption was 0.23. On the other hand, in the photodetection element for secondary evaluation, the total amount of light absorption of the metal film 115 with respect to the incident light was 0.9, the amount of light absorption in the metal film 115 located in the concave portion 112 (a ratio to the total amount of light absorption) was 0.78, and the effective amount of absorption was 0.31. In the photodetection element for secondary evaluation, the effective amount of absorption is improved by about 35% as compared with the photodetection element for primary evaluation. From this result, it can be seen that a sensitivity improvement of about 35% can be expected in the photodetection element by adopting the configuration in which the non-Schottky junction portion having no Schottky junction with the metal film 115 is provided on the distal end side of the convex portion 113.

Further, as illustrated in FIG. 6B, in the photodetection element for secondary evaluation, it can be seen that the amount of light absorption is particularly increased in the vicinity of a boundary portion between the bottom surface and the inner wall surface of the concave portions 112. It is thought that this is because light is efficiently confined in the vicinity of the boundary portion between the bottom surface and the inner wall surface of the concave portions 112 by the insulating film 15 having a refractive index lower than that of silicon (Si) which is a constituent material of the semiconductor layer 114. This is also presumed to contribute to an increase in the effective amount of absorption in the photodetection element for secondary evaluation.

As described above, in the photodetection element 1, the Schottky junction portion S1 is locally provided on the base end side of the convex portion 13 constituting the periodic concave/convex structure 11, and the non-Schottky junction portion S2 is provided on the distal end side of the convex portion 13. As described above, in the region corresponding to the base end side of the convex portion 13, higher light absorption occurs than in the region corresponding to the distal end side of the convex portion 13 of the periodic concave/convex structure 11. Therefore, it is possible to obtain the photodetection element 1 capable of detecting near infrared light with sufficient sensitivity while suppressing a dark current by providing the Schottky junction S1 in the region in which the contribution to light absorption is high, providing the non-Schottky junction S2 in the region in which the contribution to light absorption is low, and reducing a Schottky junction area between the semiconductor layer 2 and the metal film 14.

Further, in the embodiment, the insulating film 15 is provided on the top surface of the convex portions 13. Further, the metal film 14 includes the first portion 14A covering the bottom surface and the inner wall surface of the concave portions 12, and the second portion 14B covering the insulating film 15. The Schottky junction portion S1 is formed of the first portion 14A of the metal film 14, and the non-Schottky junction portion S2 is formed of the second portion 14B. With such a configuration, since the non-Schottky junction S2 formed of the insulating film 15 is located on the top surface of the convex portions 13, an increase in the Schottky junction area between the semiconductor layer 2 and the metal film 14 can be prevented even when the area of the metal film 14 is increased, and a sufficient degree of freedom of design of the metal film 14 can be ensured. Further, since the second portion 14B of the metal film 14 is located on the top surface of the convex portions 13, light absorption efficiency in the first portion 14A of the metal film 14 can be improved due to the reflection of light in the second portion 14B. Furthermore, since the insulating film used as a mask at the time of fabrication of the periodic concave/convex structure 11 can be used as the insulating film 15 as it is, simplification of the fabricating process can be achieved.

Further, in the embodiment, the thickness of the insulating film 15 is equal to or smaller than the height T of the convex portion 13. Accordingly, hot carriers generated in the metal film 14 in the vicinity of the base end side of the convex portion 13 can reach not only the Schottky junction portion S1 on the bottom surface of the concave portions 12, but also the Schottky junction portion S1 in a semiconductor layer region in the inner wall surface of the concave portions 12. Therefore, the sensitivity of the photodetection element 1 can be further improved.

Further, in the embodiment, the refractive index of the insulating film 15 is lower than the refractive index of the semiconductor layer 2. Accordingly, light can be easily confined in the first portion 14A of the metal film 14, and the light absorption efficiency can be further improved.

Further, in the embodiment, the thickness of the metal film 14 may be equal to or greater than 20 nm. When the thickness of the metal film 14 is equal to or greater than 20 nm, the effective amount of absorption of the light L in the metal film 14 is maximized, and the sensitivity of the photodetection element 1 can be improved.

Further, in the embodiment, the semiconductor layer 2 is formed of silicon. Accordingly, an inexpensive fabricating process can be realized, and the photodetection element 1 can be fabricated at low cost. When the metal film 14 includes aluminum, ease of fabrication of the metal film 14 through a silicon process can be ensured. Further, when the metal film 14 is formed of a plurality of films including a first film in contact with the semiconductor layer 2 and a second film having a refractive index smaller than that of the first film, light can be confined in the vicinity of the interface with the semiconductor layer 2 in the metal film 14, and the amount of light absorption can be further improved.

Further, in the embodiment, the concave portions 12 in the periodic concave/convex structure 11 have a matrix-shaped arrangement pattern in a plan view, and a transverse sectional shape of the concave portion 12 is a circular shape (see FIG. 3). Thus, when a matrix-shaped arrangement pattern is adopted, the light L in any polarization directions is uniformly converted to surface plasmon. Therefore, it is possible to detect light independently of the polarization direction. Further, when a circular shape is adopted as the transverse sectional shape of the concave portion 12, an area in which the light L is affected by the periodicity of the periodic concave/convex structure 11 is reduced, and therefore, the light is converted into surface plasmon in a wide wavelength range. Therefore, it is possible to detect light over a wide wavelength range.

The present disclosure is not limited to the above embodiment. For example, although the ohmic electrode 4 and the Schottky electrode 5 are provided on the front surface 2a of the semiconductor layer 2 in the above embodiment, the ohmic electrode 4 may be provided on the back surface 2b of the semiconductor layer 2. In this case, an opening may be provided in the ohmic electrode 4 in correspondence to the incidence surface F, and the ohmic electrode 4 may be formed of a material having transparency to the light L. Examples of an electrode material having transparency include indium tin oxide.

Further, although the ohmic electrode 4 and the Schottky electrode 5 are exposed on the front surface 2a of the semiconductor layer 2 in the above embodiment, an insulating protective film may be formed on the surfaces of the ohmic electrode 4 and the Schottky electrode 5. In this case, technical effects such as protection of the periodic concave/convex structure 11 at the time of element assembly and prevention of short-circuiting of the ohmic electrode 4 are obtained. Furthermore, an antireflection film may be provided on the incidence surface F. Accordingly, efficiency of incidence of the light L can be improved.

Further, the semiconductor layer 2 can be thinned such that a detection region can be extended to a range between near infrared light and visible light. With the thinning of the semiconductor layer 2, improvement of a response speed due to miniaturization of the photodetection element 1 and improvement of spatial resolution due to a shortened diffusion distance of the light L incident from the incidence surface F in the element can also be achieved. The semiconductor layer 2 may be thinned over the entire back surface 2b of the semiconductor layer 2 or may be thinned only in a region corresponding to the periodic concave/convex structure 11. In the former case, a configuration in which a glass substrate is provided on the back surface 2b of the semiconductor layer 2 may be adopted.

As a further application structure, in the periodic concave/convex structure 11, the arrangement pitch in the row direction and the arrangement pitch in the column direction of the concave portions 12 arranged in a matrix form may be different from each other. In this case, detection of light at two wavelengths having different polarization directions can be performed. Further, a plurality of periodic concave/convex structures 11 may be provided on the front surface 2a of the semiconductor layer 2, and the photodetection element 1 may be formed as an array. In this case, it is possible to perform detection of a plurality of wavelengths by changing the arrangement pitch of the concave portions 12 for each of the periodic concave/convex structures 11 and to cause the photodetection element 1 to function as a spectroscopic sensor.

Further, in the embodiment, the concave portions 12 of which the transverse sectional shape is a circular shape in the periodic concave/convex structure 11 are arranged in a matrix form, but the arrangement pattern of the periodic concave/convex structure 11 is not limited thereto. For example, the concave portions 12 may have a staggered arrangement pattern. Further, for example, the transverse sectional shape of the concave portion 12 may be another shape such as a rectangular shape or a triangular shape. A longitudinal sectional shape of the concave portion 12 is not limited to a quadrangular shape and may be another shape such as a trapezoidal shape or a triangular shape. A bottom surface of the concave portions 12 is not limited to a flat surface and may be concavely curved or spherical. When a rectangular shape is adopted as the transverse sectional shape of the concave portion, the area in which the light L is affected by the periodicity of the periodic concave/convex structure 11 is widened, and therefore, the light L is converted into a strong surface plasmon at a specific wavelength. Therefore, it is possible to detect light with high sensitivity at the specific wavelength.

Figure 8:
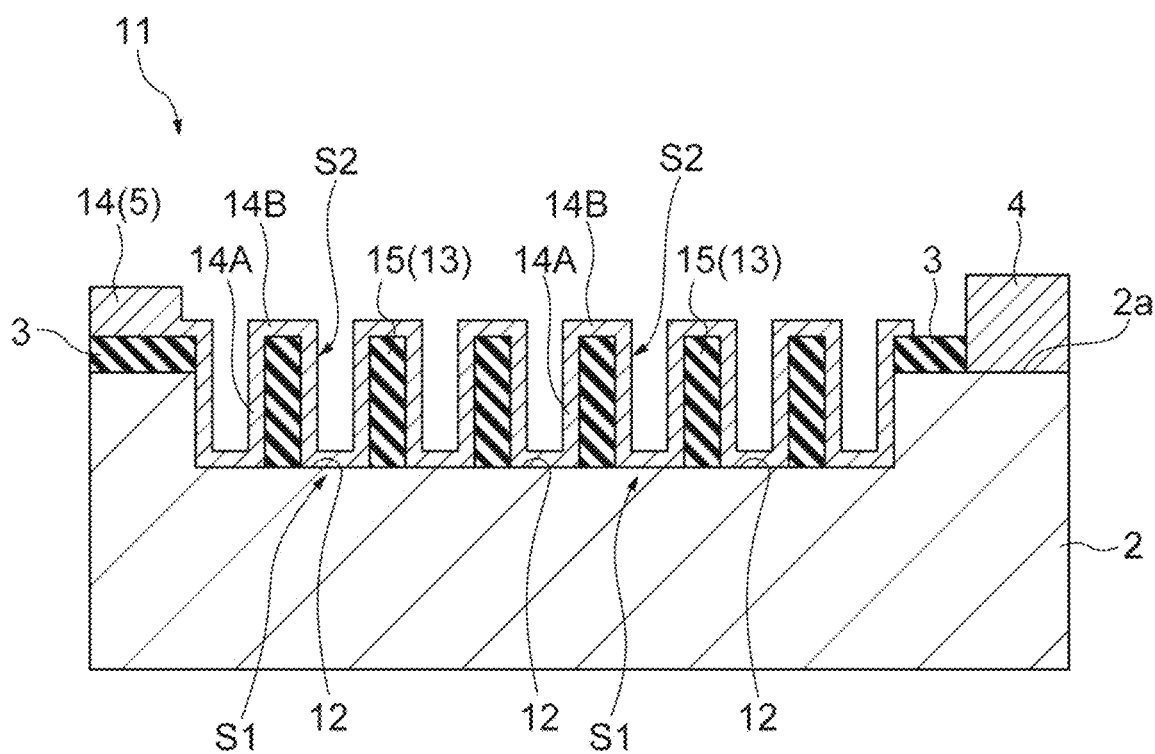
FIG. 8 is an enlarged sectional view of main parts illustrating a modification example of the periodic concave/convex structure.

Further, although the configuration in which the insulating film 15 is provided on the top surface of the convex portions 13 has been illustrated, the convex portion 13 itself of the periodic concave/convex structure 11 may be formed of the insulating film 15, as illustrated in FIG. 8. In this case, a bottom surface region of the concave portion 12 in which the contribution to light absorption is high becomes the Schottky junction portion S1, and the sufficient sensitivity of the photodetection element 1 can be ensured. Further, since the entire convex portion 13 is the non-Schottky junction S2, an increase in the Schottky junction area between the semiconductor layer 2 and the metal film 14 can be prevented even when an area of the metal film 14 increases, and a sufficient degree of freedom of design of the metal film 14 can be ensured. Further, since a surface of the semiconductor layer 2 in contact with the metal film 14 and a surface of the semiconductor layer 2 in contact with the insulating film 15 are substantially flat, lattice defects can be reduced and a dark current can be further reduced. It should be noted that, although not illustrated, the height of the bottom surface region of the concave portion 12 in the periodic concave/convex structure 11 may coincide with the surface 2a of the semiconductor layer 2. In this case, the surface 2a of the semiconductor layer 2 can be made flat, and ease of fabrication can be ensured.

Figure 9:
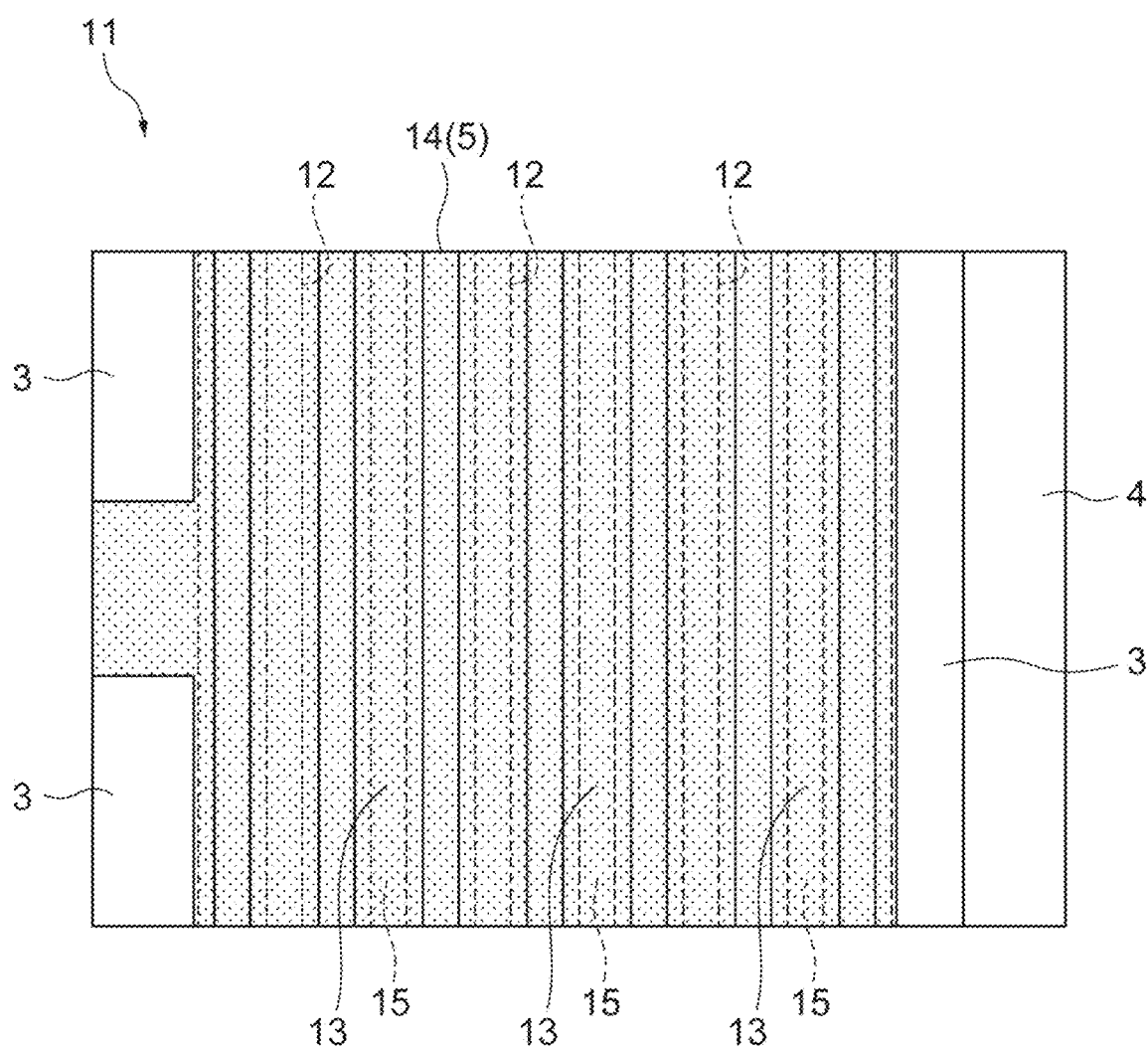
FIG. 9 is a plan view illustrating another modification of the periodic concave/convex structure.

Further, as illustrated in FIG. 9, the concave portions 12 in the periodic concave/convex structure 11 may have a stripe-shaped arrangement pattern in a plan view. When the stripe-shaped arrangement pattern is adopted, only the light L of which an electric field vector is orthogonal to the stripe-shaped arrangement pattern is converted into strong surface plasmon in the periodic concave/convex structure 11. Therefore, it is possible to detect light with high sensitivity in one polarization direction.

Further, although not illustrated, the concave portions 12 in the periodic concave/convex structure 11 may have a concentric circular arrangement pattern in a plan view or may have a concentric polygonal arrangement pattern in a plan view. When a concentric circular arrangement pattern is adopted, the light L in any polarization directions is uniformly converted to the surface plasmon. Therefore, it is possible to detect light independently of the polarization direction. When a concentric rectangular arrangement pattern is adopted, only the light L of which an electric field vector is orthogonal to each side of the concentric rectangular arrangement pattern is converted into a strong surface plasmon in the periodic concave/convex structure 11. Therefore, it is possible to detect light with high sensitivity in two polarization directions.

Further, although the metal film 14 is provided to cover the entire surface of the periodic concave/convex structure 11 using the insulating film 15 in the above embodiment, the metal film 14 may not be used and the metal film 14 may include a first portion 14A that covers the bottom surface and the inner wall surface of the concave portions 12, and a second portion 14B that is provided on the top surface side of the convex portion 13 to connect portions of the first portions 14A covering the bottom surface and the inner wall surface of the adjacent concave portions 12 and 12.

Figure 10A:
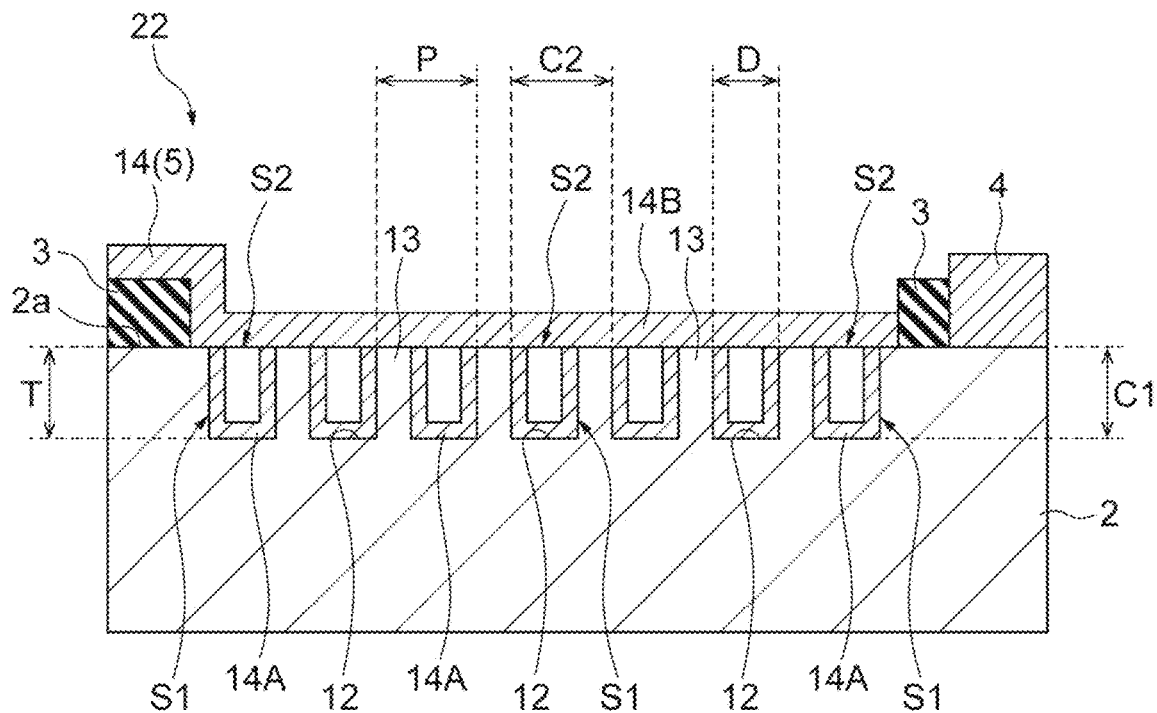
FIG. 10A is a cross-sectional view taken along a line A-A in FIG. 11.
Figure 10B:
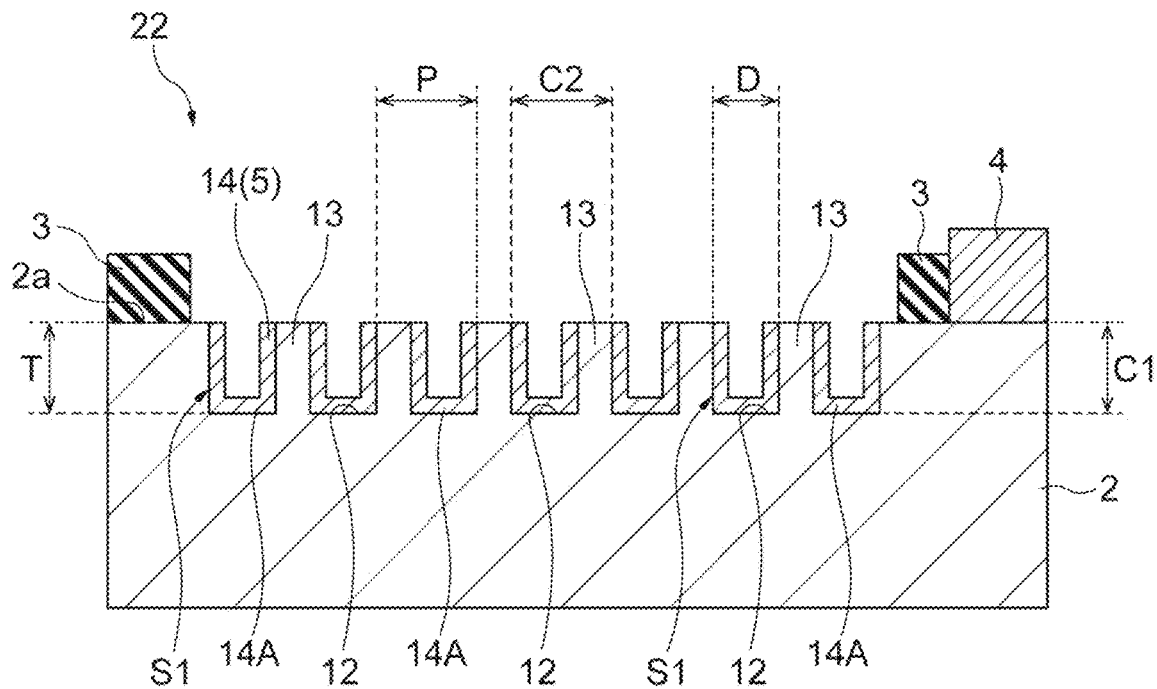
FIG. 10B is a cross-sectional view taken along a line B-B in FIG.
Figure 11:
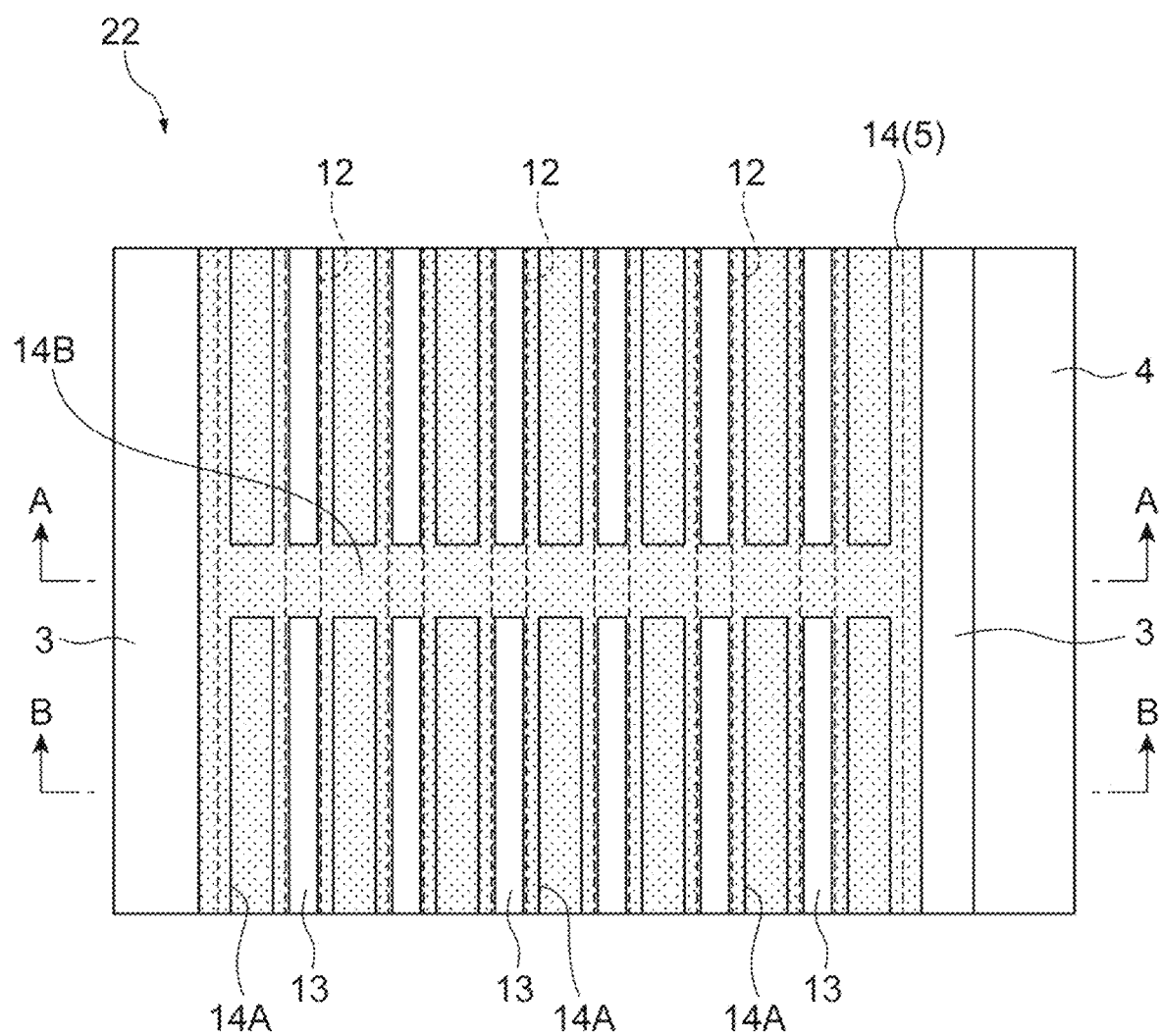
FIG. 11 is a plan view illustrating another modification example of the periodic concave/convex structure.

FIGS. 10A and 10B are enlarged cross-sectional views of main parts illustrating a configuration of the vicinity of the periodic concave/convex structure according to such a modification example. Further, FIG. 11 is a plan view thereof. FIG. 10A is a cross-sectional view taken along a line A-A in FIG. 11, and FIG. 10B is a cross-sectional view taken along a line B-B in FIG. 11. As illustrated in FIGS. 10A, 10B and 11, in the periodic concave/convex structure 21, the concave portion 12 has a stripe-shaped arrangement pattern in a plan view. The first portion 14A of the metal film 14 is provided to cover the bottom surface and the inner wall surface of the concave portions 12. Accordingly, a Schottky junction portion S1 is formed on the base end side of the convex portion 13.

On the other hand, the second portion 14B of the metal film 14 is provided in a direction substantially orthogonal to the extending direction of the concave portion 12 in the top surface of the convex portions 13, and connects the top surfaces of the first portions 14A covering the bottom surface and the inner wall surface of adjacent concave portions 12 and 12. Here, the second portion 14B has a band shape wider than the width D of the concave portion 12. In a region in which the second portion 14B is formed, the second portion 14B is provided to cover the top surface of the convex portions 13, and the Schottky junction portion S1 is formed between the top surface of the convex portions 13 and the second portion 14B, as illustrated in FIGS. 10A and 11. In a region in which the second portion 14B is not formed, the top surface of the convex portions 13 is exposed from the metal film 14, and the non-Schottky junction portion S2 is formed, as illustrated in FIGS. 10B and 11.

Figure 12:
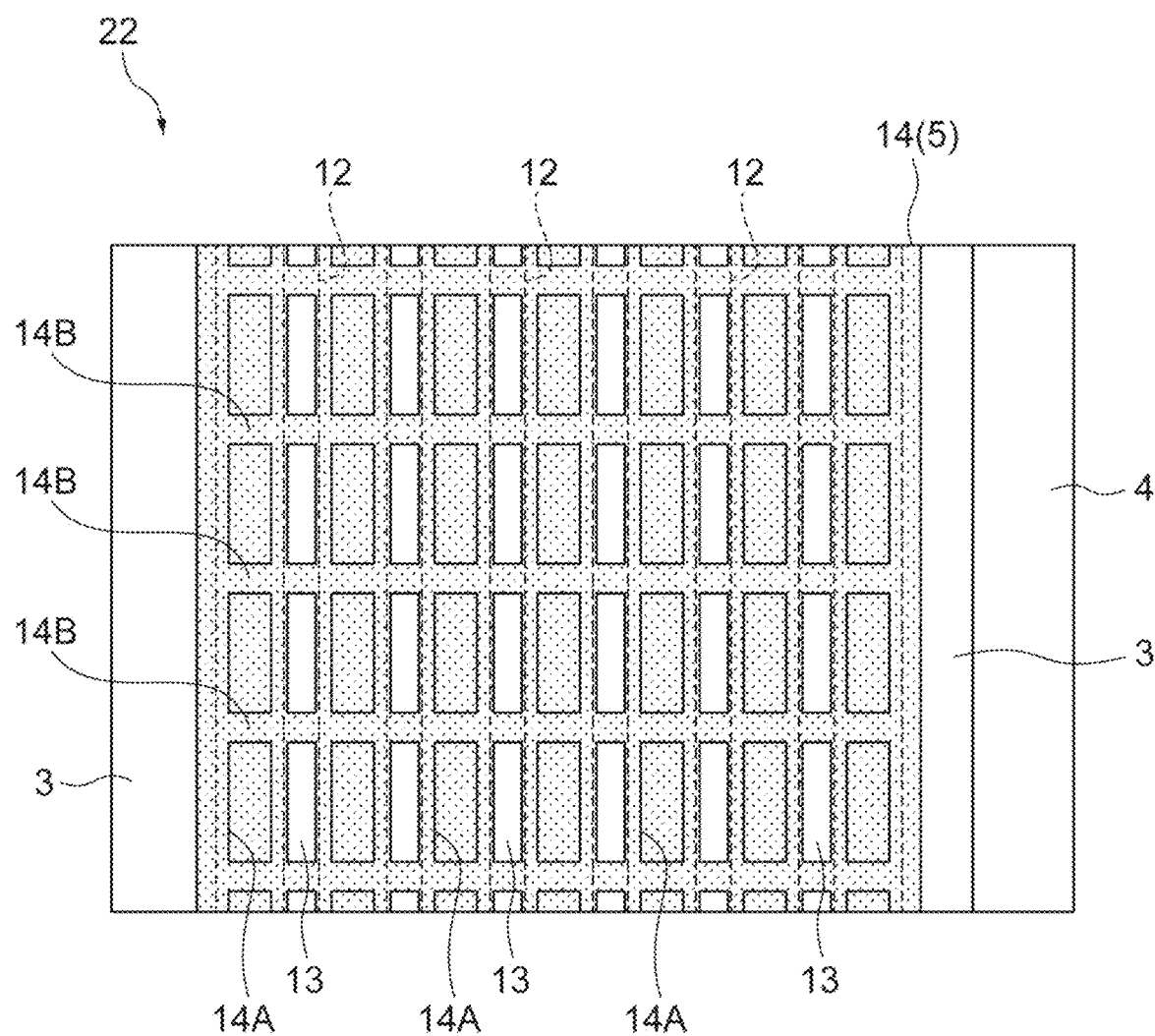
FIG. 12 is a plan view illustrating still another modification example of the periodic concave/convex structure illustrated in FIG. 11.

In this case, the Schottky junction portion S1 and the non-Schottky junction can be realized with a simple structure in which the insulating film 15 has been omitted. In the configuration illustrated in FIG. 11, the first portions 14A and 14A covering the adjacent concave portions 12 and 12 are connected to each other in a localized manner by the band-shaped second portion 14B which is wider than the width D of the concave portion 12. However, as illustrated in FIG. 12, a plurality of band-shaped second portions 14B narrower than the width D of the concave portion 12 may be provided at regular intervals, and the first portions 14A and 14A covering the adjacent concave portions 12 and 12 may be distributed and connected by the plurality of second portions 14B.

Figure 13:
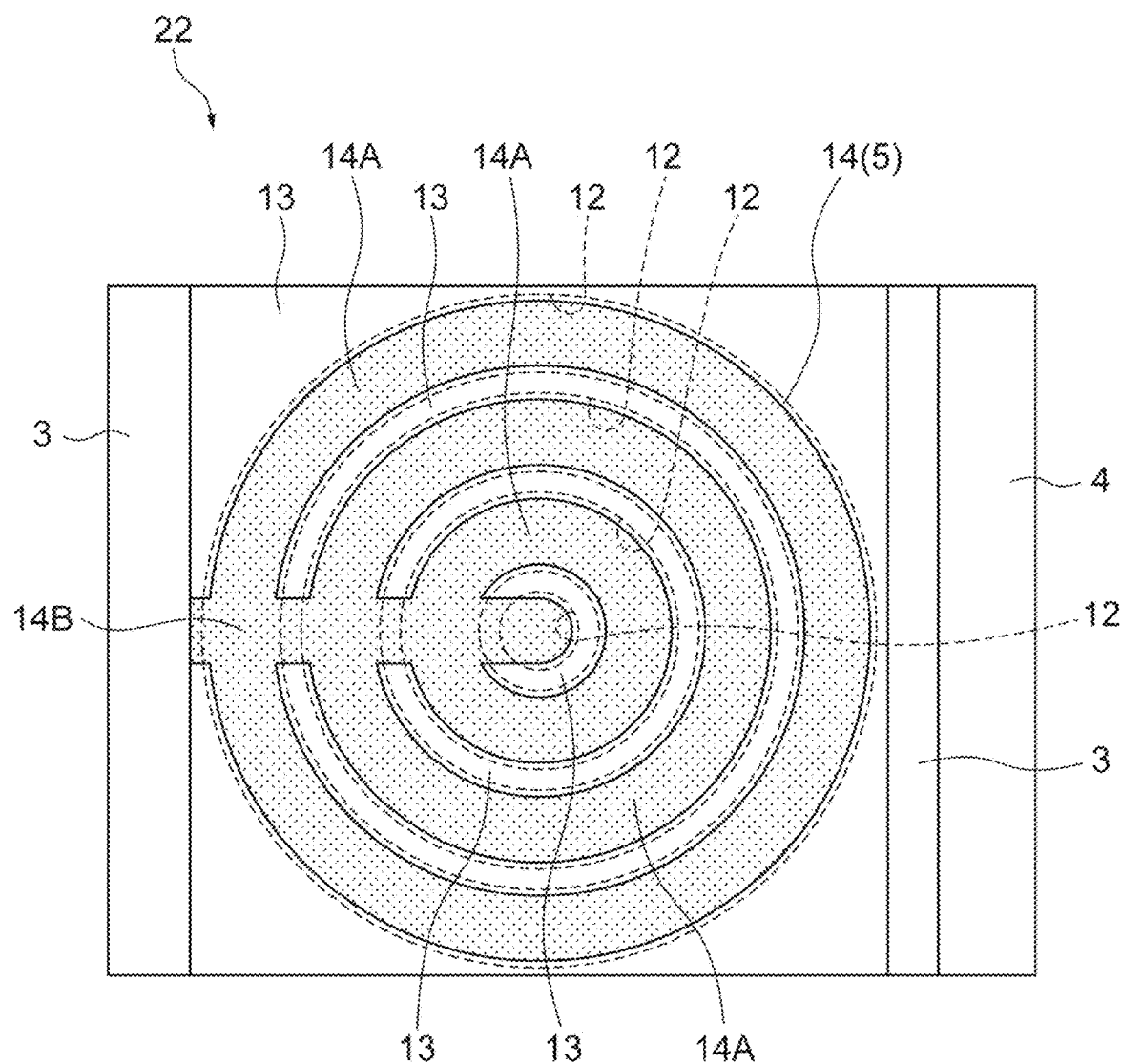
FIG. 13 is a plan view illustrating still another modification example of the periodic concave/convex structure illustrated in FIG. 11.
Figure 14:
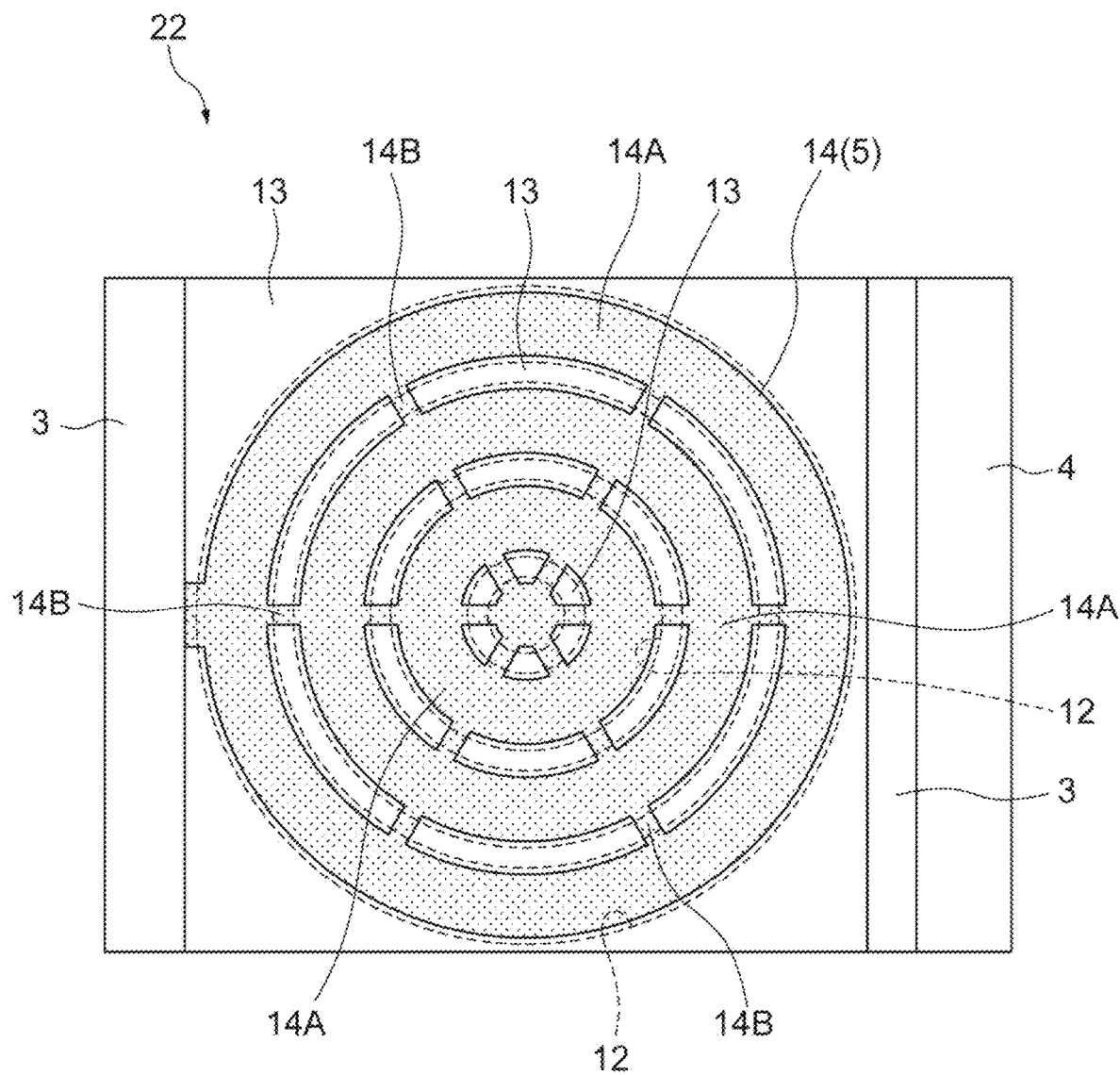
FIG. 14 is a plan view illustrating still another modification example of the periodic concave/convex structure illustrated in FIG. 11.

Further, although the concave portions 12 have a stripe-shaped arrangement pattern in a plan view in FIG. 11, the concave portions 12 may have a concentric circular arrangement pattern in a plan view or may have a concentric quadrangular shape in a plan view. Further, the concave portions 12 may have a matrix-shaped arrangement pattern as illustrated in FIG. 3. When a concentric circular arrangement pattern is adopted, the first portion 14A of the metal film 14 may be provided to cover the bottom surface and the inner wall surface of the concave portions 12 and the band-shaped second portion 14B wider than the width D of the concave portion 12 may extend in one direction in a radial direction from a center of concentric circles, for example, as illustrated in FIG. 13. Further, for example, as illustrated in FIG. 14, the first portion 14A of the metal film 14 may be provided to cover the bottom surface and the inner wall surface of the concave portions 12, and the band-shaped second portion 14B wider than the width D of the concave portion 12 may extend in a plurality of directions in the radial direction from the center of concentric circles.

Figure 15:
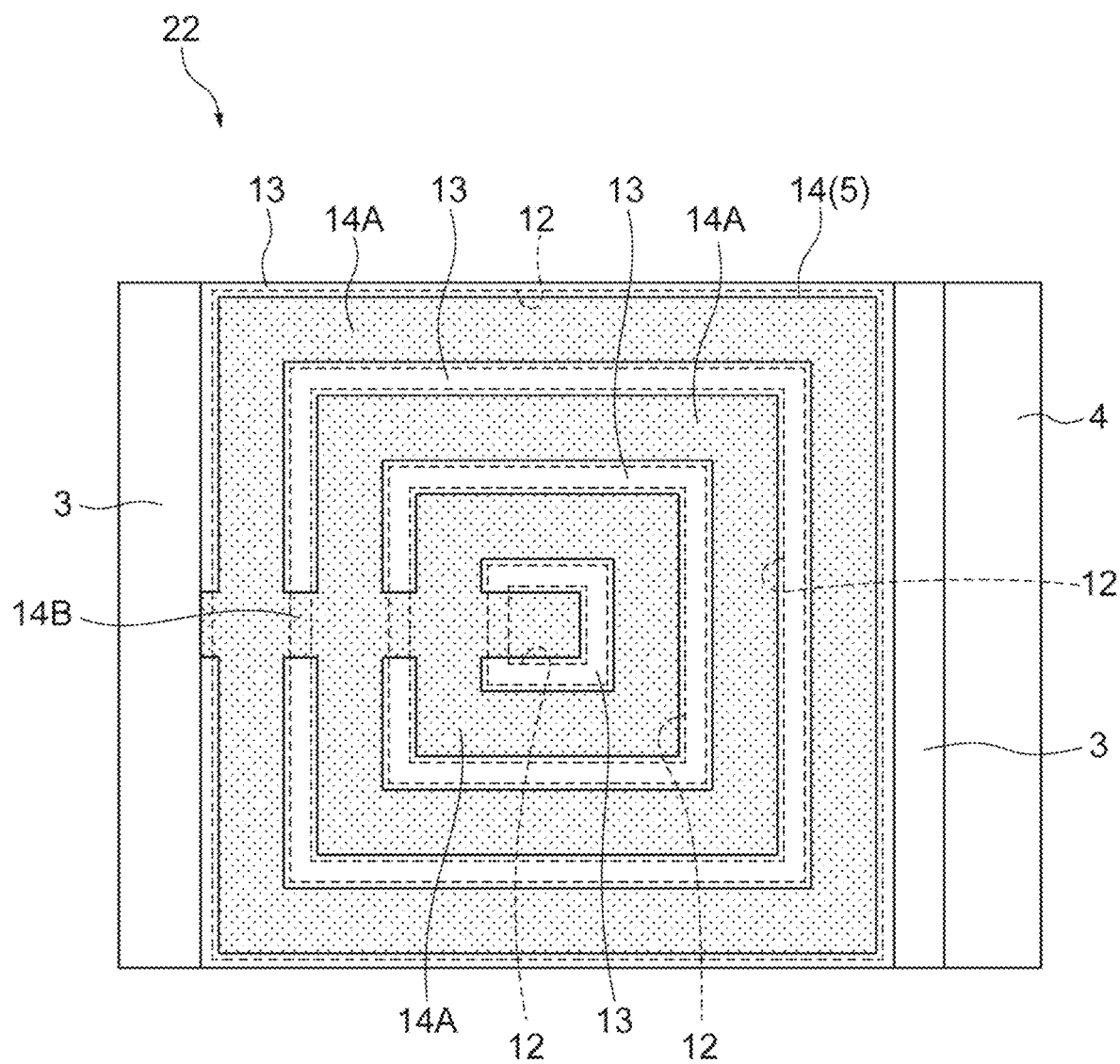
FIG. 15 is a plan view illustrating still another modification example of the periodic concave/convex structure illustrated in FIG. 11.
Figure 16:
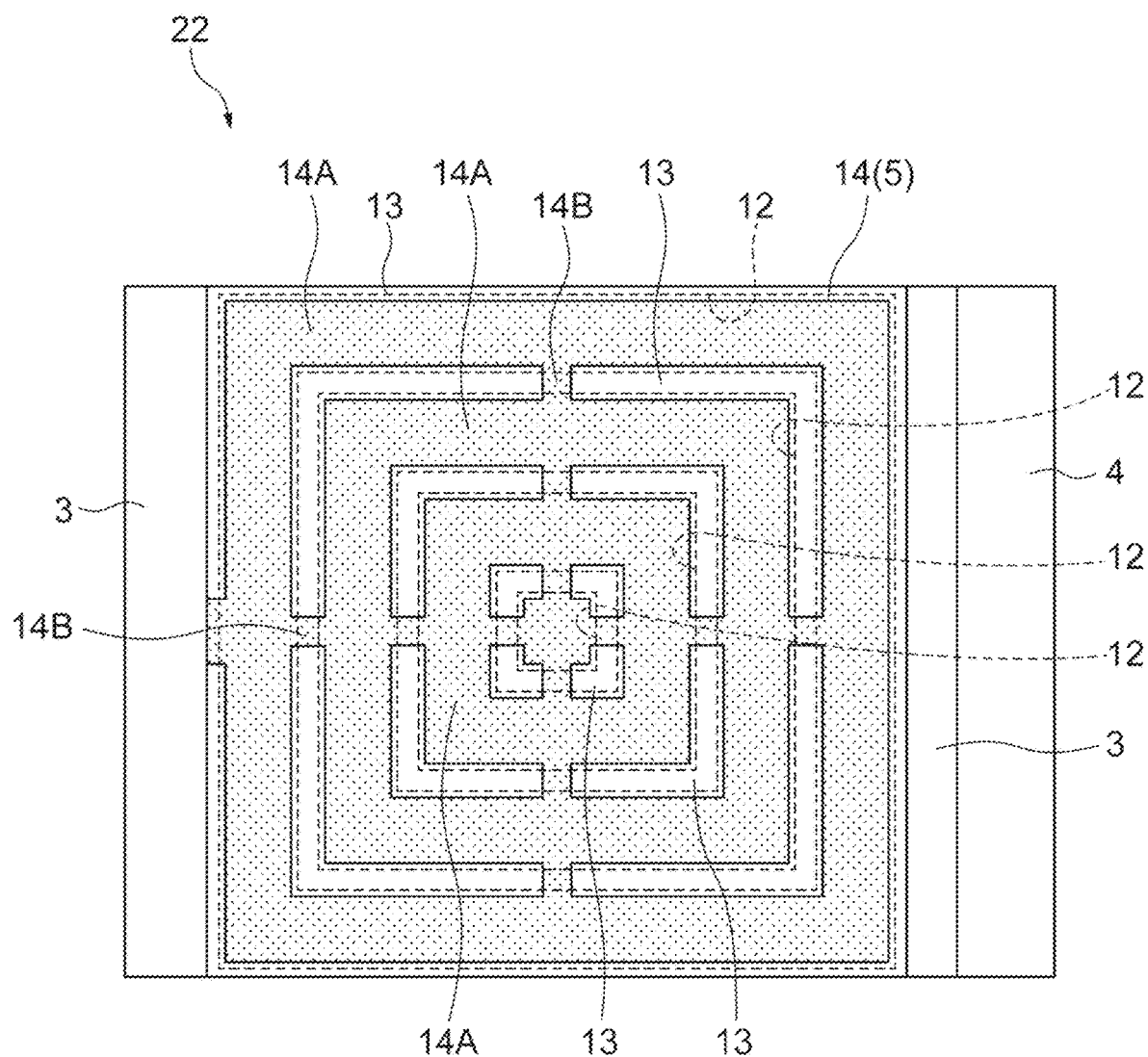
FIG. 16 is a plan view illustrating still another modification example of the periodic concave/convex structure illustrated in FIG. 11.

When a concentric quadrilateral arrangement pattern is adopted, the first portion 14A of the metal film 14 is provided to cover the bottom surface and the inner wall surface of the concave portions 12, and the band-shaped second portion 14B wider than the width D of the concave portion 12 may extend from a center of concentric quadrangles to a center portion of one side, for example, as illustrated in FIG. 15. Further, for example, as illustrated in FIG. 16, the first portion 14A of the metal film 14 may be provided to cover the bottom surface and the inner wall surface of the concave portions 12, and the second portion 14B narrower than the width D of the concave portion 12 may extend from the center of concentric quadrangles to each of center portions of four sides.

Figure 17:
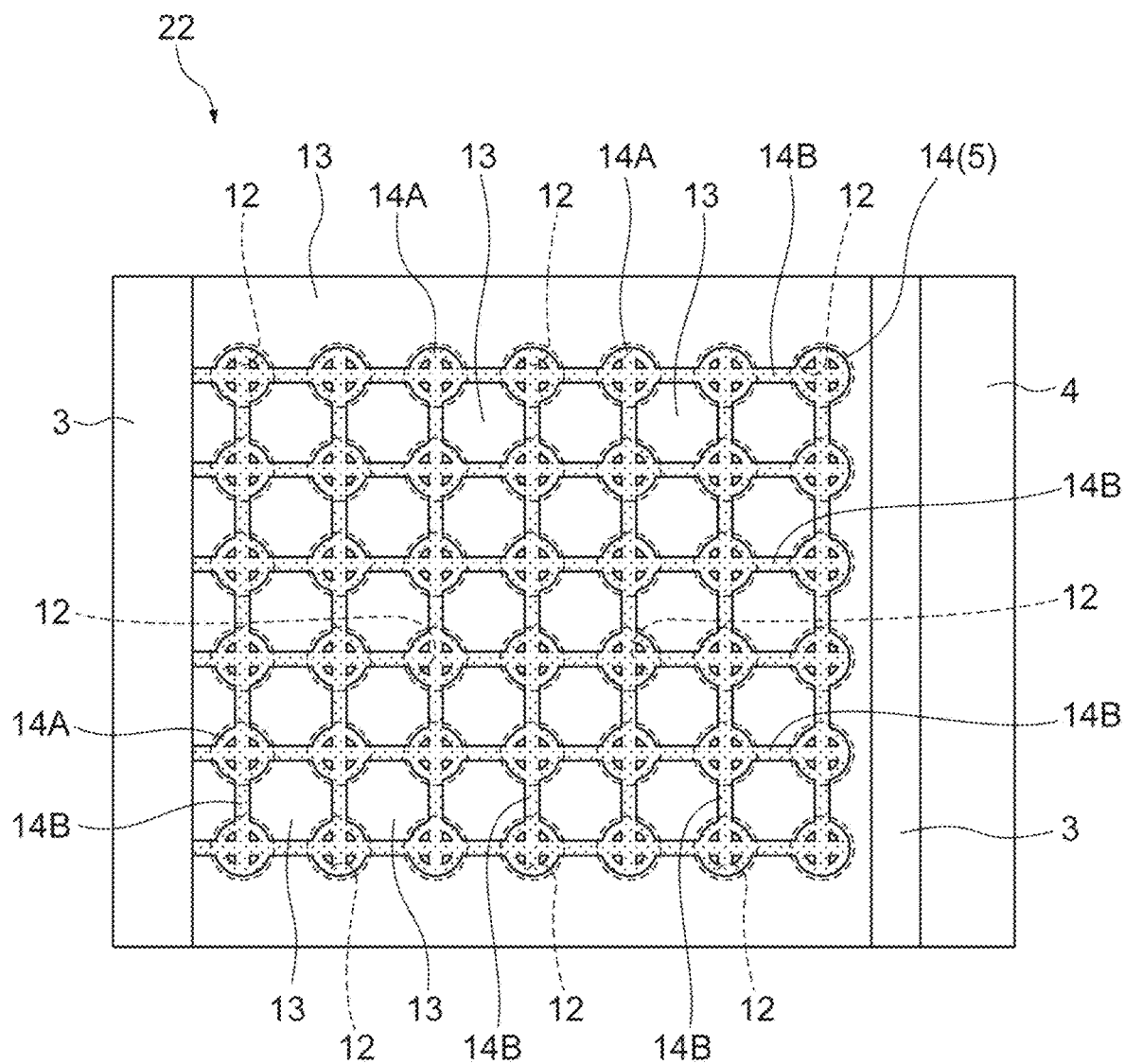
FIG. 17 is a plan view illustrating still another modification example of the periodic concave/convex structure illustrated in FIG. 11.
Figure 18:
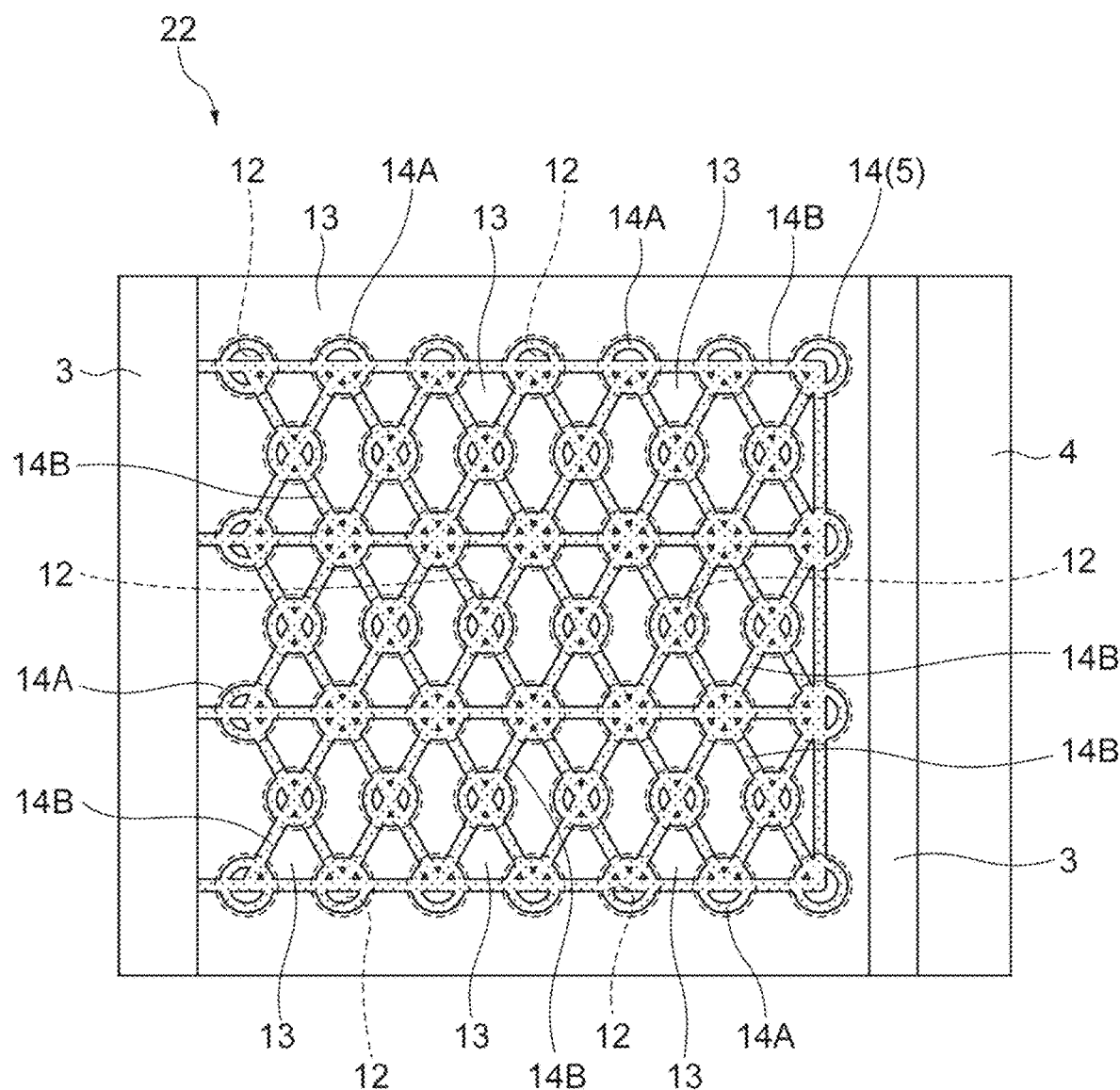
FIG. 18 is a plan view illustrating still another modification example of the periodic concave/convex structure illustrated in FIG. 11.
Figure 19:
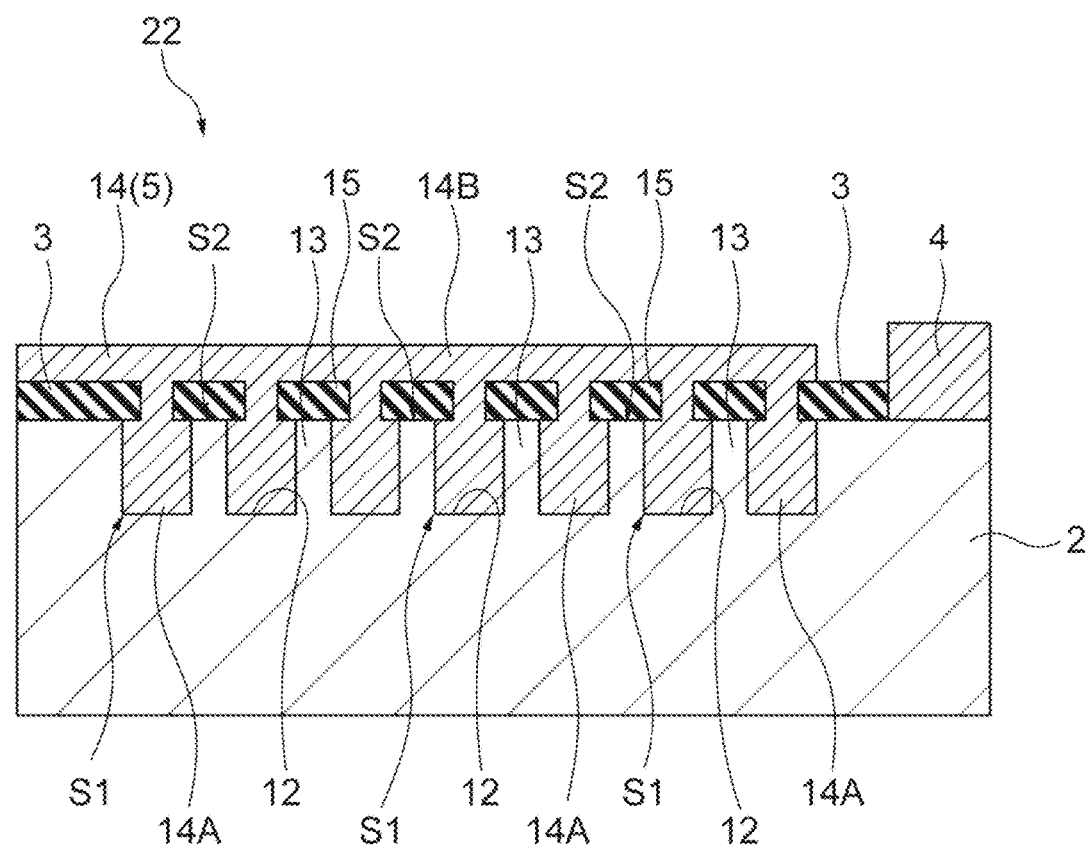
FIG. 19 is an enlarged cross-sectional view of main parts illustrating still another modification example of the periodic concave/convex structure illustrated in FIG. 11.

When a matrix-shaped arrangement pattern is adopted, the first portion 14A of the metal film 14 is provided to cover the bottom surface and the inner wall surface of the concave portions 12, and the band-shaped second portion 14B narrower than the width D of the concave portion 12 may be provided in a lattice shape so as to pass through a center of each concave portion 12, for example, as illustrated in FIG. 17. Further, as still another modification example, for example, as illustrated in FIG. 18, a staggered arrangement pattern may be adopted. In this case, the first portion 14A of the metal film 14 is provided to cover the bottom surface and the inner wall surface of the concave portions 12, and the band-shaped second portion 14B narrower than the width D of the concave portion 12 may be provided in a lattice shape so as to pass through the center of each concave portion 12. Further, for example, as illustrated in FIG. 19, a configuration in which the insulating film 15 has been combined may be adopted. In this case, the insulating film 15 may be provided on the top surface of the convex portions 13, the first portion 14A of the metal film 14 may be provided in the entire inside of the concave portion 12, and the band-shaped second portion 14B narrower than the width D of the concave portion 12 may be provided in a lattice shape so as to pass through the center of each concave portion 12. Further, the second portion 14B may be connected to the first portion 14A at an opening surface of the concave portions 12 via an opening portion of the insulating film 15.

Figure 20:
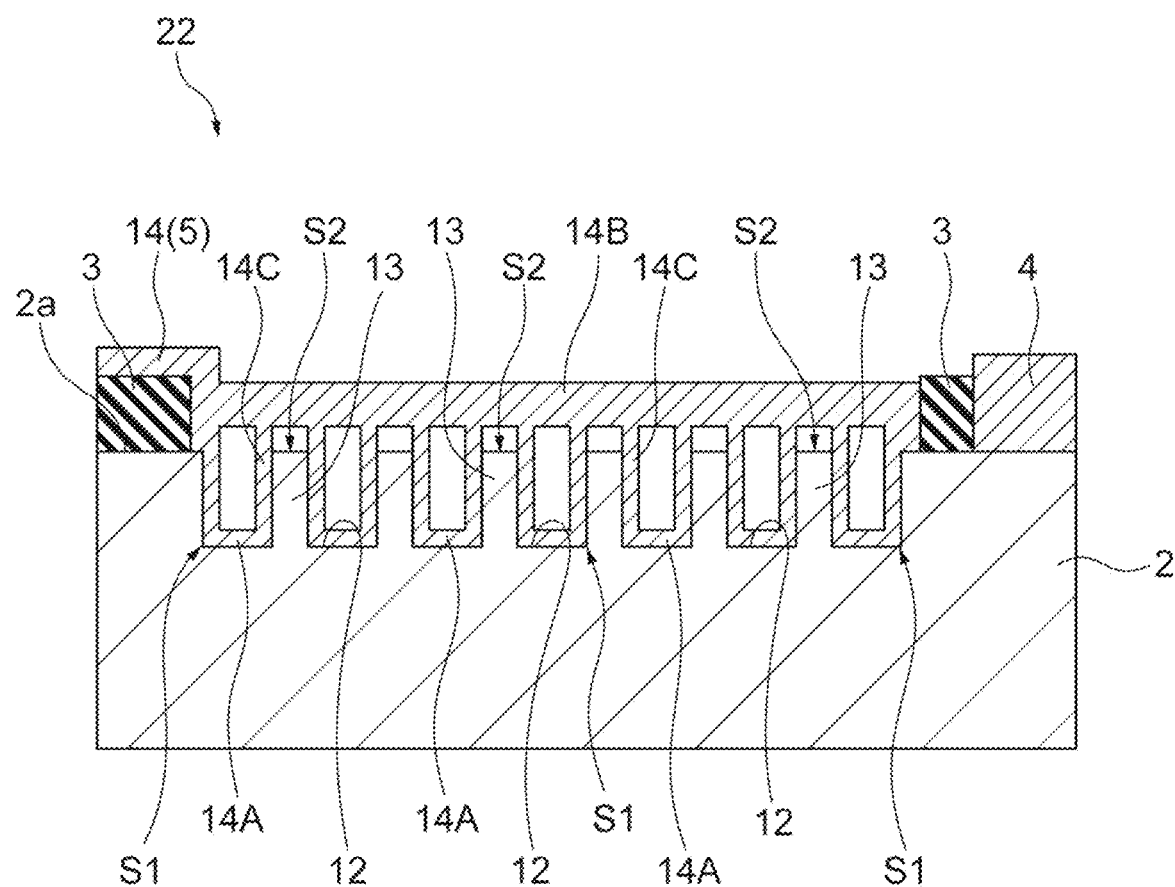
FIG. 20 is an enlarged cross-sectional view of main parts illustrating still another modification example of the periodic concave/convex structure illustrated in FIG. 11.

As still another modification example, as illustrated in FIG. 20, a projection portion 14C projecting from the top surface of the convex portions 13 may be provided in the first portion 14A of the metal film 14, and the second portion 14B may be provided to be spaced apart from the top surface of the convex portions 13 so as to connect adjacent projection portions 14C and 14C. In this case, the arrangement pattern of the concave portion 12 and the metal film 14 can adopt the same pattern as each of the patterns illustrated in FIGS. 11 to 18. According to such a configuration, since the non-Schottky junction portion S2 is located on the top surface of the convex portions 13 due to the separation of the second portion 14B, an increase in the Schottky junction area between the semiconductor layer 2 and the metal film 14 can be prevented even when an area of the second portion 14B of the metal film 14 increases. Therefore, since an area of the metal film 14 can be ensured, electrical resistance of the photodetection element 1 can be reduced. In each of the embodiments illustrated in FIGS. 10 to 19, the convex portion 13 itself may be constituted by the insulating film 15, as illustrated in FIG. 8.

Figure 21:
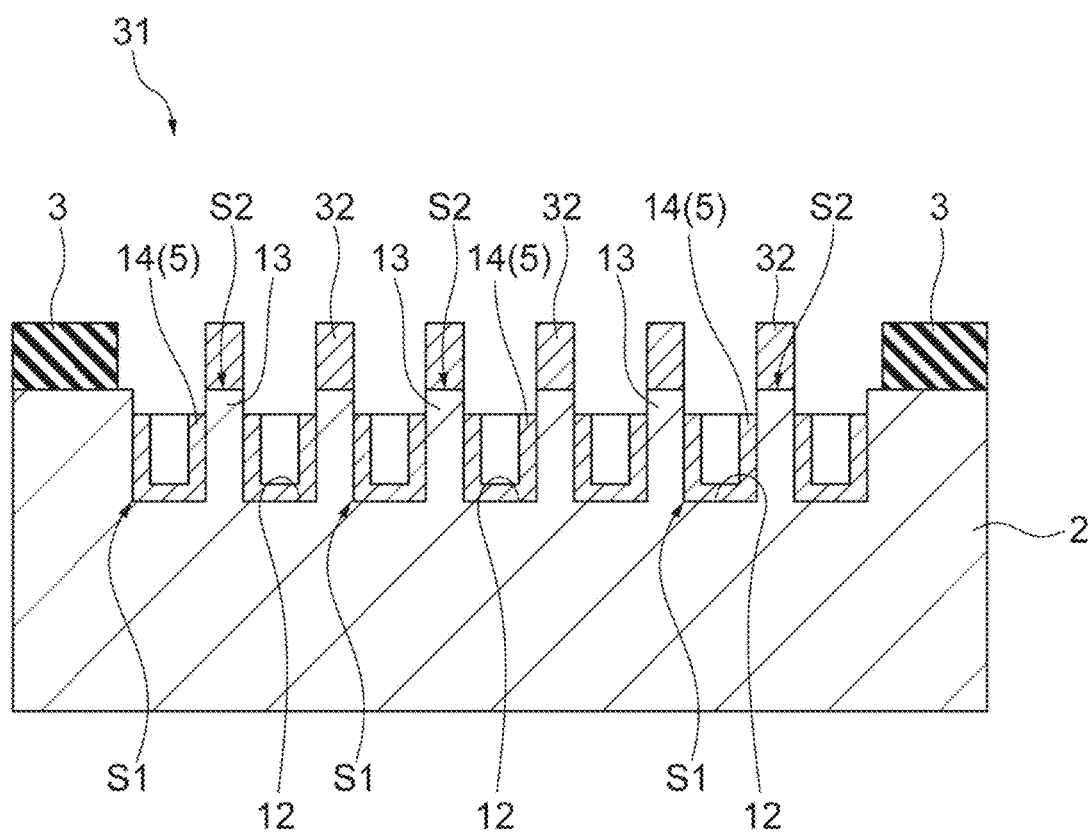
FIG. 21 is an enlarged sectional view of main parts illustrating still another modification of the periodic concave/convex structure.
Figure 22:
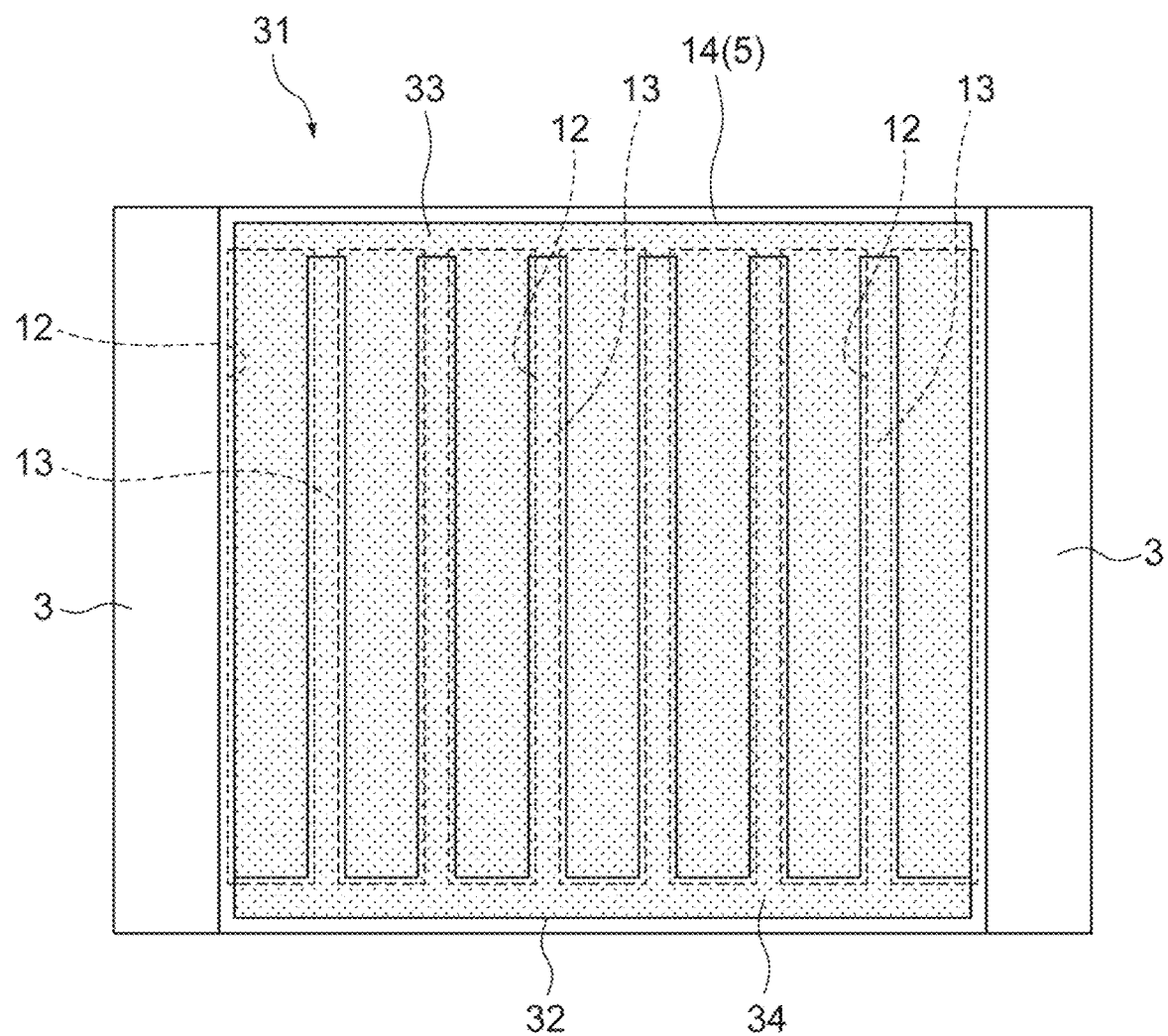
FIG. 22 is a plan view of the periodic concave/convex structure illustrated in FIG. 21.

Further, a configuration in which an ohmic electrode 32 that is in ohmic junction with the semiconductor layer 2 is provided on the top surface of the convex portions 13 instead of the configuration in which the insulating film 15 is provided on the top surface of the convex portions 13 may be adopted. In this case, the ohmic electrode 4 can be omitted. FIG. 21 is an enlarged cross-sectional view of main parts illustrating a configuration in the vicinity of the periodic concave/convex structure according to such a modification example. Further, FIG. 22 is a plan view thereof. As illustrated in FIGS. 21 and 22, in the periodic concave/convex structure 31, the concave portion 12 has a stripe-shaped arrangement pattern in a plan view. The metal film 14 is provided to cover a portion other than the vicinity of the top surface of the convex portions 13 in the bottom surface and the inner wall surface of the concave portions 12. Accordingly, the Schottky junction portion S1 is formed on the base end side of the convex portion 13.

On the other hand, the ohmic electrode 32 is provided in a stripe-shaped pattern on the top surface of the convex portions 13 located between adjacent concave portions 12 and 12. A thickness of the ohmic electrode 32 is, for example, smaller than the height T of the convex portion 13 and is substantially the same thickness as or slightly smaller than the thickness of the insulating film 3. The vicinity of the top surface of the convex portions 13 on the inner wall surface of the concave portions 12 is not covered with the metal film 14 and the ohmic electrode 32 is provided on the top surface of the convex portions 13. Accordingly, a non-Schottky junction portion S2 is formed on the distal end side of the convex portion 13. According to such a configuration, light absorption efficiency in the metal film 14 can be improved due to the reflection of the light L at the ohmic electrode 32 provided on the top surface of the convex portions 13. Further, since the ohmic electrode 32 is located on the top surface of the convex portions 13, the element area can be reduced. Therefore, it is possible to downsize and integrate the photodetection element 1.

Figure 23:
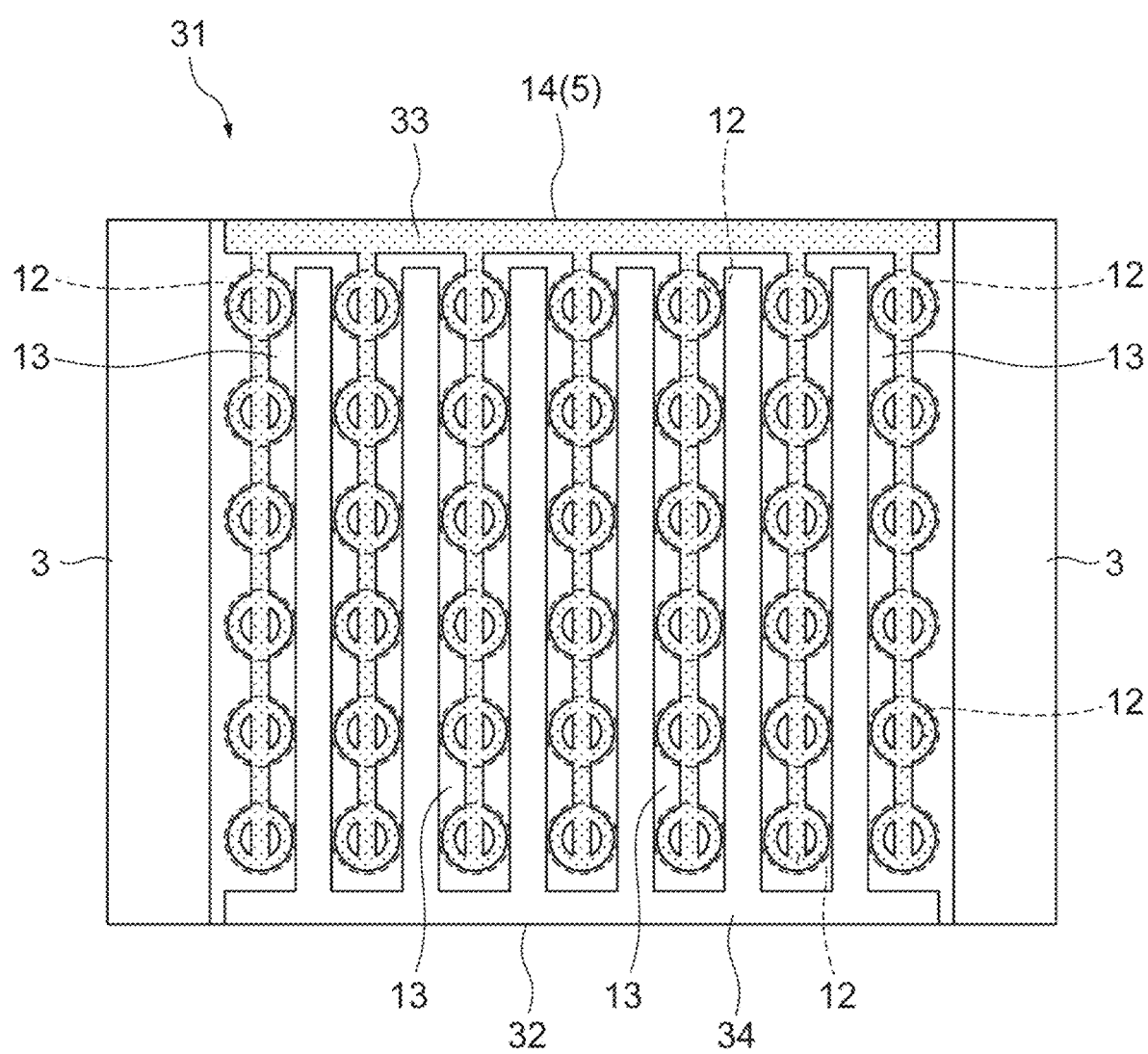
FIG. 23 is a plan view illustrating still another modification example of the periodic concave/convex structure illustrated in FIG. 21.

In the examples illustrated in FIGS. 21 and 22, the metal film 14 includes a band-shaped connection portion 33 narrower than the width D of the concave portion 12. The connection portion 33 is provided in a direction crossing the extending direction of the concave portion 12 on one end side of the periodic concave/convex structure 31. The metal films 14 and 14 in adjacent concave portions 12 and 12 are connected by the connection portions 33. Further, the ohmic electrode 32 includes a band-shaped connection portion 34 narrower than the width D of the concave portion 12. The connection portion 34 is provided in a direction crossing the extending direction of the concave portion 12 on the other end side of the periodic concave/convex structure 31. The ohmic electrodes 32 and 32 adjacent to each other with the concave portion 12 interposed therebetween are connected by the connection portion 34. This embodiment can also be applied to a case in which the concave portions 12 have a matrix-shaped arrangement pattern in a plan view, for example, as illustrated in FIG. 23.

Figure 24:
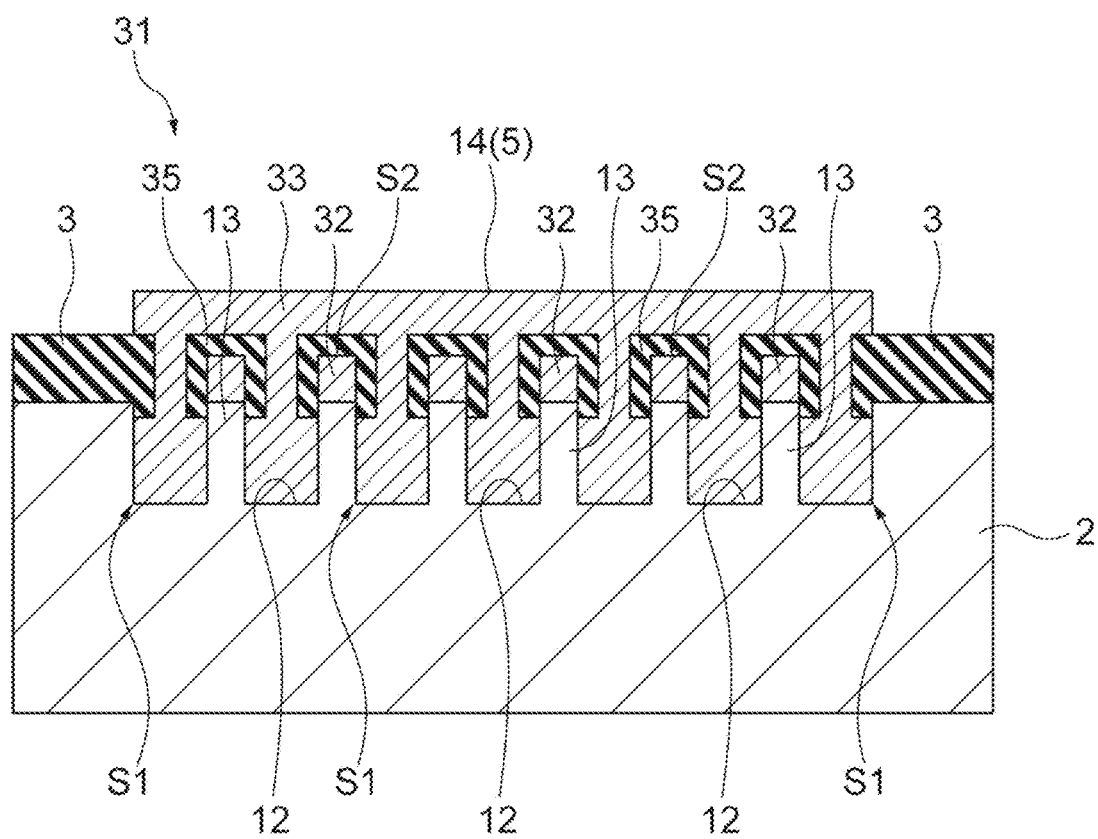
FIG. 24 is an enlarged cross-sectional view of main parts illustrating still another modification example of the periodic concave/convex structure.
Figure 25:
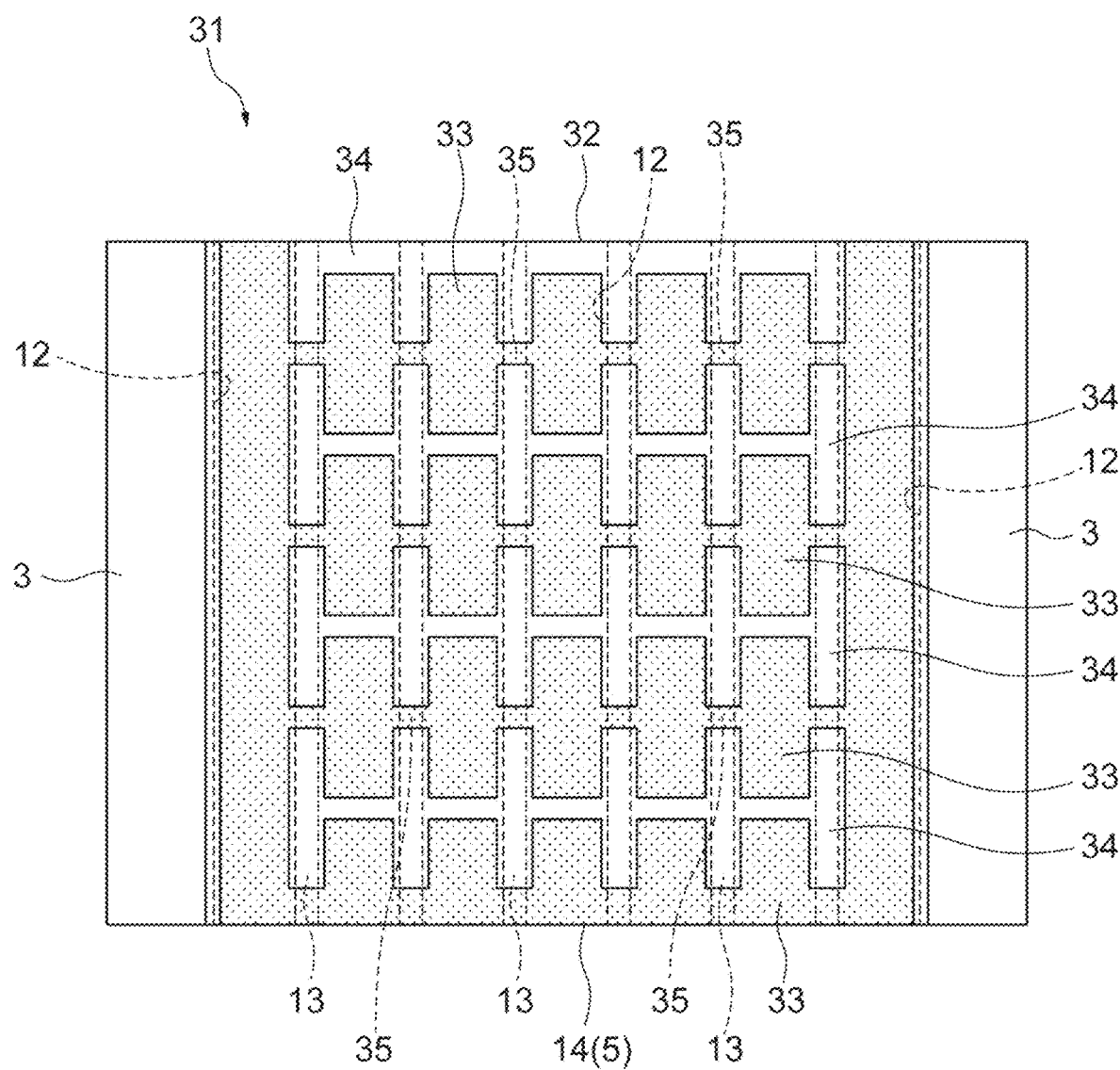
FIG. 25 is a plan view of the periodic concave/convex structure illustrated in FIG. 24.
Figure 26:
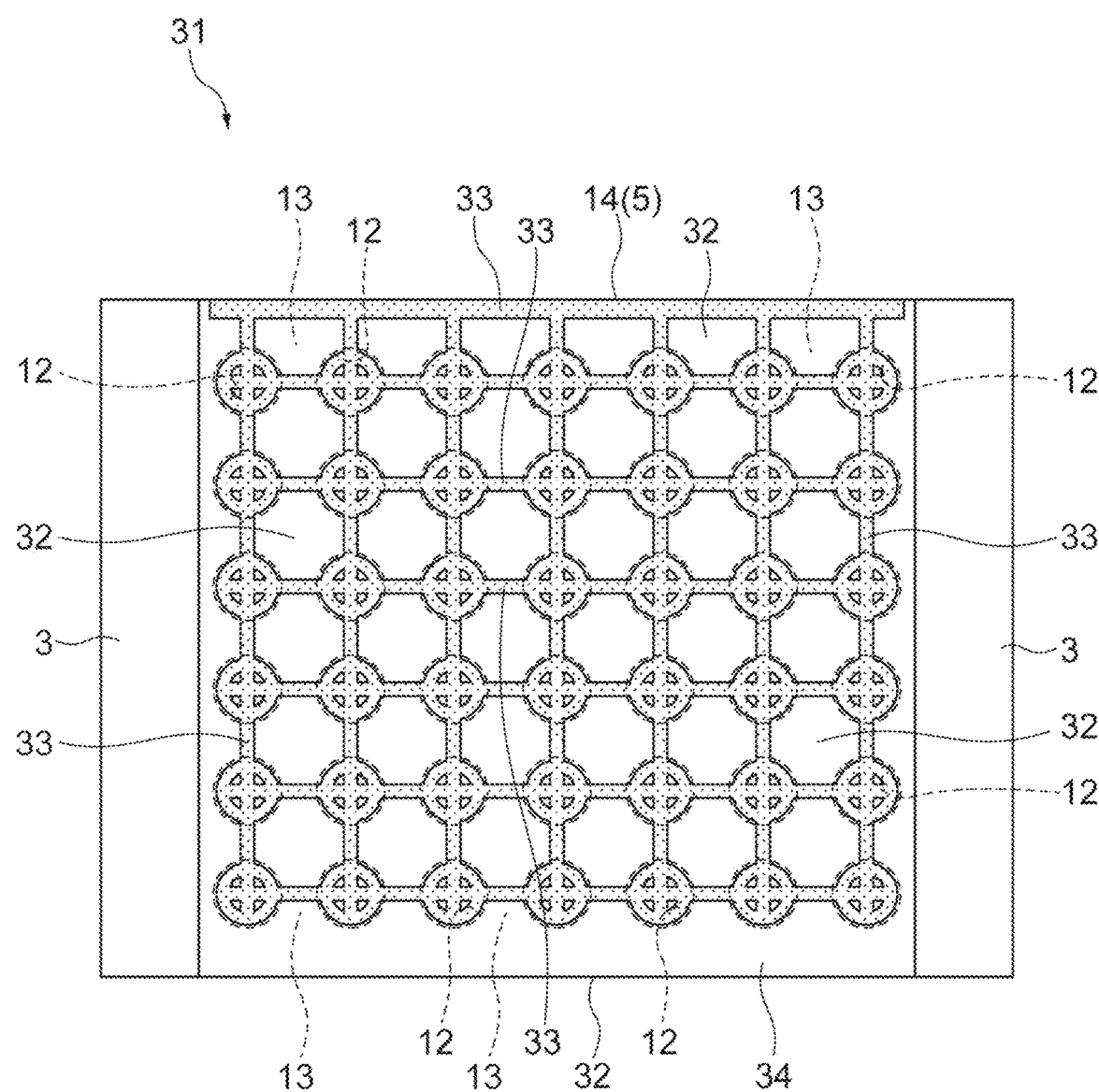
FIG. 26 is a plan view illustrating still another modification example of the periodic concave/convex structure illustrated in FIG. 24.

As still another modification example, a configuration in which the insulating film 35 is combined, for example, as illustrated in FIGS. 24 and 25, may be adopted. In this example, a plurality of connection portions 33 of the metal film 14 are provided at regular intervals in a direction crossing an extending direction of the concave portion 12. Further, the insulating film 15 may be formed to cover the ohmic electrode 32 provided on the top surface of the convex portions 13 at a position at which the connection portion 33 is formed. A plurality of connection portions 34 of the ohmic electrode 32 (see FIG. 25) may be provided at regular intervals in a direction crossing the extending direction of the concave portion 12 so as to alternate with the connection portions 33 of the metal film 14. This embodiment can also be applied to a case in which the concave portions 12 have a matrix-shaped arrangement pattern in a plan view, for example, as illustrated in FIG. 26.

It should be noted that, in the above embodiment, although the back-surface incidence type photodetection element having the light incidence surface on the back surface of the semiconductor layer has been illustrated, the present disclosure can also be applied to a front-surface incidence type photodetection element having the light incidence surface on the front surface of the semiconductor layer.

DESCRIPTION OF REFERENCE NUMERALS

1 Photodetection element
2 Semiconductor layer
11, 21, 31 Periodic concave/convex structure
14 Metal film
14A First portion
14B Second portion
14C Projection portion
15, 35$x$ Insulating film
32 Ohmic electrode
L Light
S1 Schottky junction portion
S2 Non-Schottky junction portion
T Height of convex portion

What is claimed is:

1. A photodetection element, comprising:
   a semiconductor layer having, on one surface side, a periodic concave/convex structure that includes periodic convex portions and concave portions and, on an other surface side, an incidence surface for light, wherein the periodic concave/convex structure converts light incident from the incident surface into surface plasmon; and
   a metal film provided on the one surface side of the semiconductor layer in correspondence to the periodic concave/convex structure,
   wherein in the periodic concave/convex structure, a Schottky junction portion that has a Schottky junction with the metal film is provided on a base end side of the convex portion, and a non-Schottky junction portion that does not have a Schottky junction with the metal film is provided on a distal end side of the convex portion,
   wherein an insulating film is provided on a top surface of the convex portions,
   the metal film includes a first portion covering a bottom surface and an inner wall surface of the concave portion, and a second portion covering the insulating film, and
   the Schottky junction portion is formed of the first portion, and the non-Schottky junction portion is formed of the second portion.

2. The photodetection element according to claim 1, wherein a refractive index of the insulating film is smaller than a refractive index of the semiconductor layer.

3. The photodetection element according to claim 1, wherein a thickness of the metal film is equal to or greater than 20 nm.

4. The photodetection element according to claim 1, wherein the semiconductor layer is formed of silicon.

5. The photodetection element according to claim 1, wherein the metal film includes aluminum.

6. The photodetection according to claim 1, wherein the metal film is formed of a plurality of films including a first film in contact with the semiconductor layer and a second film with a refractive index smaller than that of the first film element.

* * * * *